(12) United States Patent
Ikeda et al.

(10) Patent No.: US 11,437,340 B2
(45) Date of Patent: Sep. 6, 2022

(54) ELECTRONIC MODULE, METHOD OF MANUFACTURING CONNECTOR, AND METHOD OF MANUFACTURING ELECTRONIC MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 1111 days.

(21) Appl. No.: 15/782,011

(22) PCT Filed: May 19, 2017

(86) PCT No.: PCT/JP2017/018823
§ 371 (c)(1),
(2) Date: Jun. 6, 2018

(87) PCT Pub. No.: WO2018/211683
PCT Pub. Date: Nov. 22, 2018

(65) Prior Publication Data
US 2020/0273833 A1    Aug. 27, 2020

(51) Int. Cl.
*H01L 23/00* (2006.01)
*H01L 25/07* (2006.01)
(Continued)

(52) U.S. Cl.
CPC .......... *H01L 24/35* (2013.01); *H01L 21/4842* (2013.01); *H01L 23/49562* (2013.01);
(Continued)

(58) Field of Classification Search
CPC ............. H01L 23/49562; H01L 23/492; H01L 23/49524; H01L 23/49575;
(Continued)

(56) References Cited

U.S. PATENT DOCUMENTS

| 3,902,189 A | 8/1975 | Simpson |
| 6,401,765 B1 | 6/2002 | Carter, Jr. et al. |

(Continued)

FOREIGN PATENT DOCUMENTS

| CN | 1267396 A | 9/2000 |
| CN | 1534747 A | 10/2004 |

(Continued)

OTHER PUBLICATIONS

International Search Report for PCT/JP2017/018823, dated Aug. 1, 2017, and its English translation provided by Google Translate.

(Continued)

*Primary Examiner* — Brigitte A Paterson
(74) *Attorney, Agent, or Firm* — Ladas & Parry, LLP

(57) ABSTRACT

An electronic module has a first electronic element 13, a first connector 60 provided in one side of the first electronic element 13, and having a first columnar part 62 extending to another side and a first groove part 64 provided in a one-side surface, and a second electronic element 23 provided in one side of the first connector 60 via a conductive adhesive agent provided inside a circumference of the first groove part 64. The first connector 60 has a first concave part 67 on one side at a position corresponding to the first columnar part 62.

1 Claim, 20 Drawing Sheets

(51) Int. Cl.
*H01L 23/495* (2006.01)
*H01L 21/48* (2006.01)
*H01L 23/492* (2006.01)
*H01L 23/498* (2006.01)

(52) U.S. Cl.
CPC .............. *H01L 24/26* (2013.01); *H01L 24/37* (2013.01); *H01L 24/40* (2013.01); *H01L 24/744* (2013.01); *H01L 24/75* (2013.01); *H01L 24/77* (2013.01); *H01L 24/83* (2013.01); *H01L 24/84* (2013.01); *H01L 24/92* (2013.01); *H01L 25/074* (2013.01); *H01L 23/492* (2013.01); *H01L 23/49524* (2013.01); *H01L 23/49575* (2013.01); *H01L 23/49844* (2013.01); *H01L 24/32* (2013.01); *H01L 24/73* (2013.01); *H01L 2224/26175* (2013.01); *H01L 2224/32245* (2013.01); *H01L 2224/32257* (2013.01); *H01L 2224/37012* (2013.01); *H01L 2224/37013* (2013.01); *H01L 2224/404* (2013.01); *H01L 2224/4005* (2013.01); *H01L 2224/40227* (2013.01); *H01L 2224/73263* (2013.01)

(58) Field of Classification Search
CPC .............. H01L 23/49844; H01L 24/26; H01L 24/37; H01L 24/40; H01L 24/32; H01L 24/73; H01L 2224/26175; H01L 2224/32245; H01L 2224/32257; H01L 2224/37012; H01L 2224/37013; H01L 2224/4005; H01L 2224/40227; H01L 2224/101; H01L 2224/73263
See application file for complete search history.

(56) References Cited

U.S. PATENT DOCUMENTS

| | | | | |
|---|---|---|---|---|
| 9,437,520 | B2* | 9/2016 | Orimoto | .................. H01L 24/32 |
| 2004/0061202 | A1 | 4/2004 | Shim et al. | |
| 2004/0187551 | A1 | 9/2004 | Iwabuchi | |
| 2005/0116246 | A1 | 6/2005 | Isokawa et al. | |
| 2007/0278511 | A1* | 12/2007 | Ohno | ...................... H01L 33/62 |
| | | | | 257/99 |
| 2010/0052149 | A1* | 3/2010 | Nose | .................. H01L 23/49503 |
| | | | | 257/692 |
| 2011/0227205 | A1 | 9/2011 | Lu et al. | |
| 2013/0093072 | A1 | 4/2013 | Zhang et al. | |
| 2016/0293561 | A1 | 10/2016 | Kadoguchi et al. | |
| 2017/0311482 | A1 | 10/2017 | Ikeda | |
| 2019/0057921 | A1* | 2/2019 | Ooshima | ............. H01L 21/4803 |

FOREIGN PATENT DOCUMENTS

| | | |
|---|---|---|
| CN | 102194788 A | 9/2011 |
| CN | 106575643 A | 4/2017 |
| EP | 1030369 A1 | 8/2000 |
| EP | 3104411 A1 | 12/2016 |
| JP | H02249257 A | 10/1990 |
| JP | H04142042 A | 5/1992 |
| JP | H04196574 A | 7/1992 |
| JP | H0536842 U | 5/1993 |
| JP | H06037122 A | 2/1994 |
| JP | 2000124384 A | 4/2000 |
| JP | 2006032774 A | 2/2006 |
| JP | 2006032775 A | 2/2006 |
| JP | 2010245212 | 10/2010 |
| JP | 2011114176 A | 6/2011 |
| JP | 2014045157 A | 3/2014 |
| JP | 2015103713 A | 6/2015 |
| KR | 101631232 B1 | 6/2016 |
| TW | 200503224 A | 1/2005 |
| WO | 2011156051 A1 | 12/2011 |

OTHER PUBLICATIONS

Written Opinion for PCT/JP2017/018823, dated Aug. 1, 2017, and its English translation provided by Google Translate.
Office Action and Search Report from NL app. No. 2020928, dated Jan. 9, 2019, with English translation.
Office Action and Search Report from TW app. No. 107114881, dated Dec. 27, 2018, with machine English translation from Google Translate.
International Search Report from PCT/JP2017/018823, dated Aug. 1, 2017, with English translation from WIPO.
First Office Action and Search Report from CN app. no. 201780005098.1, dated Sep. 29, 2021, with English translation from Global Dossier, all pages.

\* cited by examiner (a)

(b)

(a)

(b)

ELECTRONIC MODULE, METHOD OF MANUFACTURING CONNECTOR, AND METHOD OF MANUFACTURING ELECTRONIC MODULE

CROSS-REFERENCE TO RELATED APPLICATION

The present application is the U.S. national phase of PCT Application PCT/JP2017/018823 filed on May 19, 2017, the disclosure of which is incorporated herein by reference in its entirety.

TECHNICAL FIELD

The present invention relates to an electronic module having a connector, a method of manufacturing a connector, and a method of manufacturing an electronic module.

BACKGROUND ART

An electronic module having a plurality of electronic elements provided in a sealing resin has been conventionally known (see, for example, JP 2014-45157 A). Such electronic modules are desired to be downsized.

As a means for downsizing, an aspect is conceivable, in which electronic elements are stacked in a layered state. In this case, a connector may be provided in one side (for example, the obverse surface side) of an electronic element (first electronic element), and another electronic element (second electronic element) may be provided in one side of the connector via a conductive adhesive agent such as solder.

Such a connector is provided in one side of the first electronic element and hence may cause imbalance. If the connector causes imbalance in this manner, the conductive adhesive agent sometimes flows out from the one-side surface of the connector.

Adopting an aspect in which the second electronic element is provided for the connector provided for the first electronic element tends to cause confinement of heat. It is therefore beneficial to separate electronic elements from each other.

SUMMARY OF INVENTION

Technical Problem

The present invention provides an electronic module that can prevent a conductive adhesive agent from flowing out and also prevent heat generated from electronic elements from being confined by separating the electronic elements from each other.

Solution to Problem

An electronic module according to the present invention may comprise:
a first electronic element;
a first connector provided in one side of the first electronic element, and having a first columnar part extending to another side and a first groove part provided in a one-side surface; and
a second electronic element provided in one side of the first connector via a conductive adhesive agent provided inside a circumference of the first groove part,
wherein the first connector may have a first concave part on one side at a position corresponding to the first columnar part.

In the electronic module according to the present invention,
the one-side surface of the first connector may have a first inclined surface and a first flat surface provided outside the circumference of the first inclined surface,
the first groove part may be provided at a boundary between the first inclined surface and the first flat surface.

In the electronic module according to the present invention,
the one-side surface of the first connector may have a first inclined surface and a first flat surface provided outside the circumference of the first inclined surface,
the first groove part may be provided in the first flat surface.

In the electronic module according to the present invention,
the one-side surface of the first connector may have a first inclined surface and a first flat surface provided outside the circumference of the first inclined surface,
the first groove part may be provided in the first inclined surface.

In the electronic module according to the present invention,
when viewed in longitudinal cross-section, an angle formed by the first inclined surface and a surface, which is in an inner peripheral side, of the first groove part may be smaller than an angle formed by the first inclined surface and a surface, which is in an outer peripheral side, of the first groove part.

A method of manufacturing a connector according to the present invention may comprise:
a step of mounting a conductive plate on a mold having a mold concave part;
a step of forming a first columnar part corresponding to the mold concave part on another side of the conductive plate and forming a first concave part at a position corresponding to the first columnar part on one side of the conductive plate by pressing the conductive plate against the mold; and
a step of forming a first groove part in a one-side surface of the conductive plate by pressing a member having a protruding part against one side of the conductive plate.

A method of manufacturing an electronic module according to the present invention may comprise:
a step of mounting a connector according to claim 6 on a first electronic element; and
a step of mounting a second electronic element on the connector via a conductive adhesive agent,
wherein the conductive adhesive agent may be provided inside a circumference of the first groove part.

Advantageous Effects of Invention

Adopting an aspect in which a first connector has a first columnar part as an aspect of the present invention allows a first electronic element to be separated to some extent from a second electronic element, thereby letting out heat. In addition, adopting an aspect in which a first groove part is provided in the one-side surface of a first head part can prevent a conductive adhesive agent from spreading outward from the first groove part when the conductive adhesive agent is melted.

BRIEF DESCRIPTION OF DRAWINGS

FIGS. 8(a) to 8(c) are longitudinal sectional views showing a manufacturing process for the first and second connectors that can be used in the first embodiment of the present invention, emphatically showing a first columnar part, a first concave part, a second columnar part, a second concave part, and the like.

FIGS. 12(a) to 12(c) are longitudinal sectional views showing a manufacturing process for the first and second connectors that can be used in the second embodiment of the present invention, emphatically showing a first columnar part, a first concave part, a second columnar part, a second concave part, and the like.

FIGS. 15(a) to 15(c) are longitudinal sectional views showing a manufacturing process for the first and second connectors that can be used in the third embodiment of the present invention, emphatically showing a first columnar part, a first concave part, a second columnar part, a second concave part, and the like.

DESCRIPTION OF EMBODIMENTS

First Embodiment

<<Arrangement>>

Figure 1:
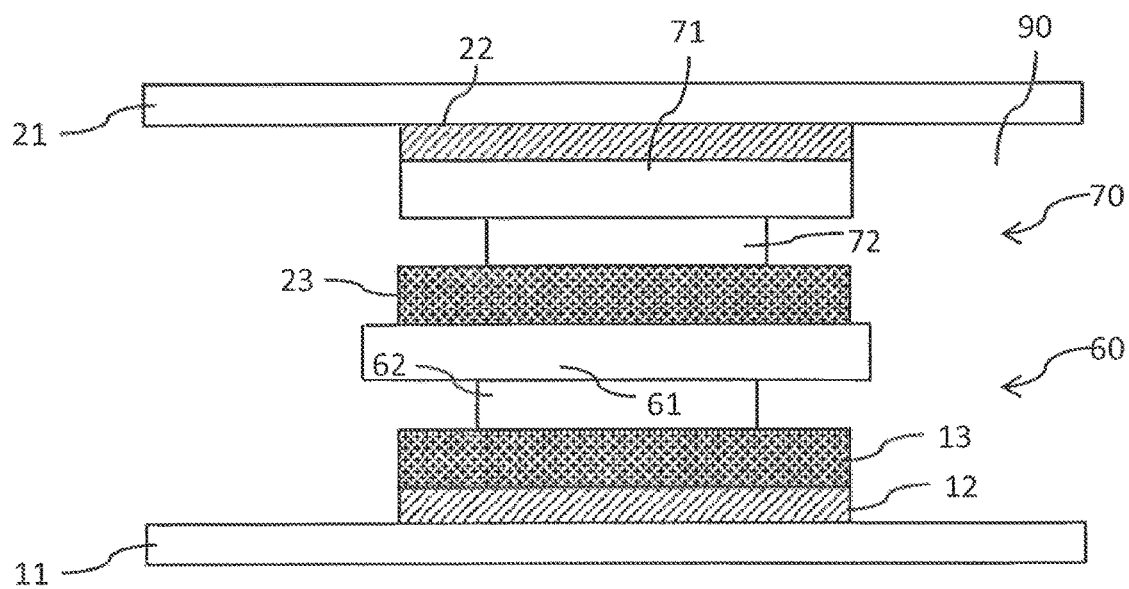
FIG. 1 is a longitudinal sectional view of an electronic module that can be used in the first embodiment of the present invention.
Figure 1:
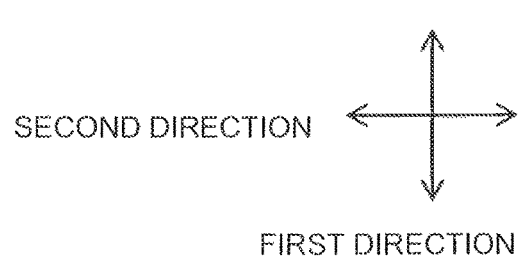

In this embodiment, "one side" indicates the upper side of FIG. 1, and "another side" indicates the lower side of FIG. 1. The up/down direction in FIG. 1 is called the "first direction", the right/left direction is called the "second direction", and the obverse/reverse direction of the drawing surface is called the "third direction". The in-planar direction including the second and third directions is called a "planar direction", and a view from one side is called a "planar view".

An electronic module according to this embodiment may have a first electronic unit and a second electronic unit.

As shown in FIG. 1, the first electronic unit may have a first substrate 11, a plurality of first conductive layers 12 provided in one side of the first substrate 11, and a first electronic element 13 provided one side of the first conductive layers 12. The first electronic element 13 may be a switching element or control element. When the first electronic element 13 is a switching element, the first electronic element 13 may be a MOSFET, IGBT, or the like. The first electronic element 13 and a second electronic element 23 each may be formed from a semiconductor element, and a semiconductor material may be silicon, silicon carbide, gallium nitride, or the like. The other-side surface of the first electronic element 13 may be connected to the first conductive layers 12 via a conductive adhesive agent such as solder.

A first connector 60 may be provided in one side of the first electronic element 13. The first connector 60 may be connected to the one-side surface of the first electronic element 13 via a conductive adhesive agent such as solder.

As shown in FIG. 1, a second electronic unit may be provided in one side of the first connector 60. The second electronic unit may have the second electronic element 23 provided in one side of the first connector 60. The second electronic unit may also have a second substrate 21 and a second conductive layer 22 provided on another side of the second substrate 21. A second connector 70 may be provided on another side of the second conductive layer 22. When the second conductive layer 22 is provided, the second electronic element 23 may be provided on the second conductive layer 22 unlike the aspect shown in FIG. 1. The second connector 70 may be connected to the one-side surface of the second electronic element 23 and the other-side surface of the second conductive layer 22 via a conductive adhesive agent such as solder.

The second electronic element 23 may be switching element or control element. When the second electronic element 23 is a switching element, the second electronic element 23 may be a MOSFET, IGBT, or the like.

The first connector 60 may have a first head part 61 and a first columnar part 62 extending from the first head part 61 to another side. The second connector 70 may have a second head part 71 and a second columnar part 72 extending from the second head part 71 to another side. The first connector 60 has a nearly T-shaped cross-section, and the second connector 70 may also have a nearly T-shaped cross-section.

Figure 2:
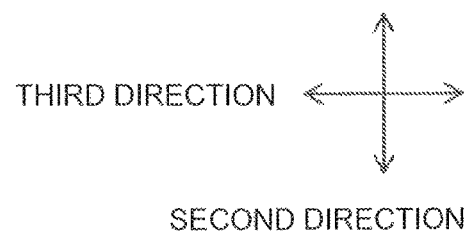
FIG. 2 is a plan view of the electronic module that can be used in the first embodiment of the present invention.
Figure 2:
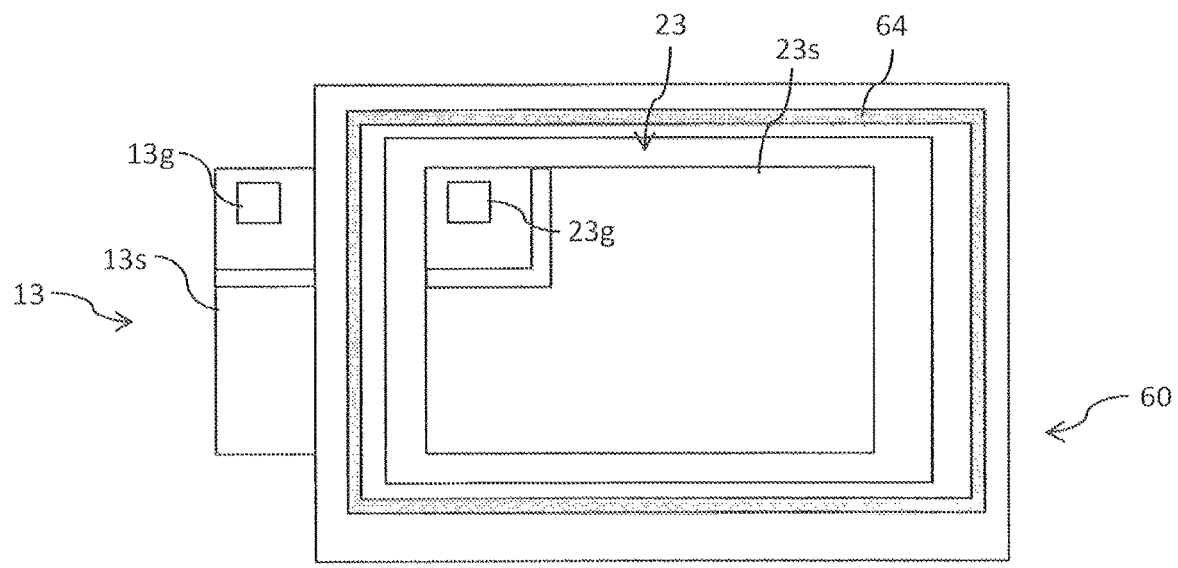

As shown in FIG. 2, a first groove part 64 may be provided in the one-side surface of the first head part 61. Although the first groove part 64 is provided outside the circumference of the first columnar part 62, the first groove part 64 may be provided outside part of the circumference of the first columnar part 62 or outside the entire circumference of the first columnar part 62 in planar view (planar direction). A conductive adhesive agent such as solder may be provided inside the circumference of the first groove part 64, which is located one the one-side surface of the first head part 61, and a second electronic element may be provided via the conductive adhesive agent. The first groove part 64 may have a rectangular cross-section as shown in FIG. 3(b) or a triangular cross-section as shown in FIG. 3(a). The triangular cross-section may be a right triangle cross-section or isosceles triangle cross-section.

Figure 4:
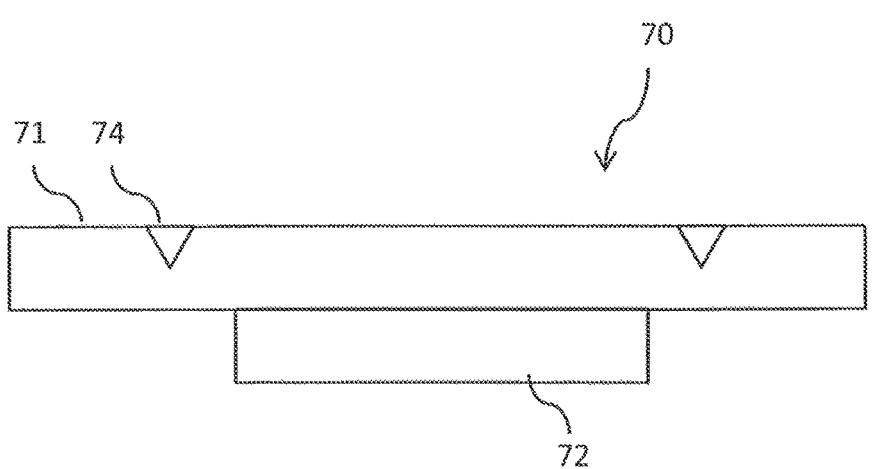
FIG. 4(a) is a longitudinal sectional view of a second connector that can be used in the first embodiment of the present invention.
FIG. 4(b) is a longitudinal sectional view of another second connector that can be used in the first embodiment of the present invention.
Figure 4:
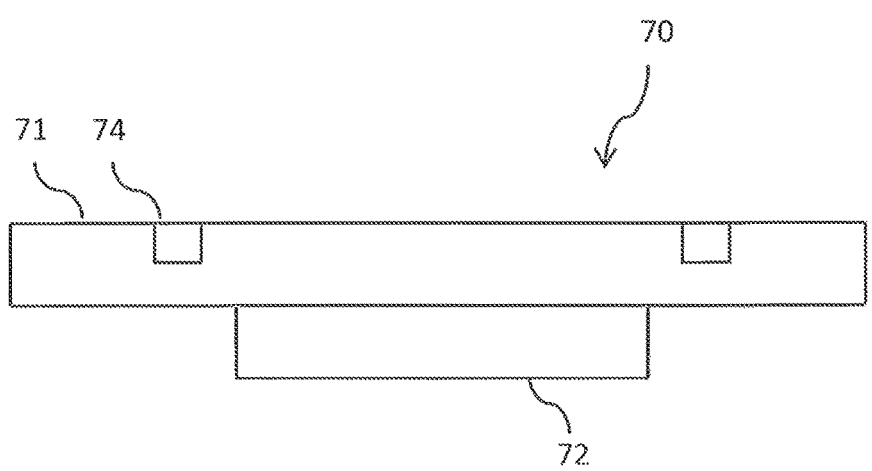

As shown in FIG. 4, a second groove part 74 may be provided in the one-side surface of the second head part 71. The second groove part 74 may be provided outside part of the circumference of the second columnar part 72 or outside the entire circumference of the second columnar part 72 in planar view. A conductive adhesive agent such as solder may be provided inside the circumference of second groove part 74, which is located on the one-side surface of the second head part 71, and the one-side surface of the second head part 71 may be connected to the second conductive layer 22 via the conductive adhesive agent. The second groove part 74 may also have a rectangular cross-section as shown in FIG. 4(b) or triangular cross-section as shown in FIG. 4(a). The triangular cross-section may be a right triangle cross-section or isosceles triangle cross-section.

Figure 5:
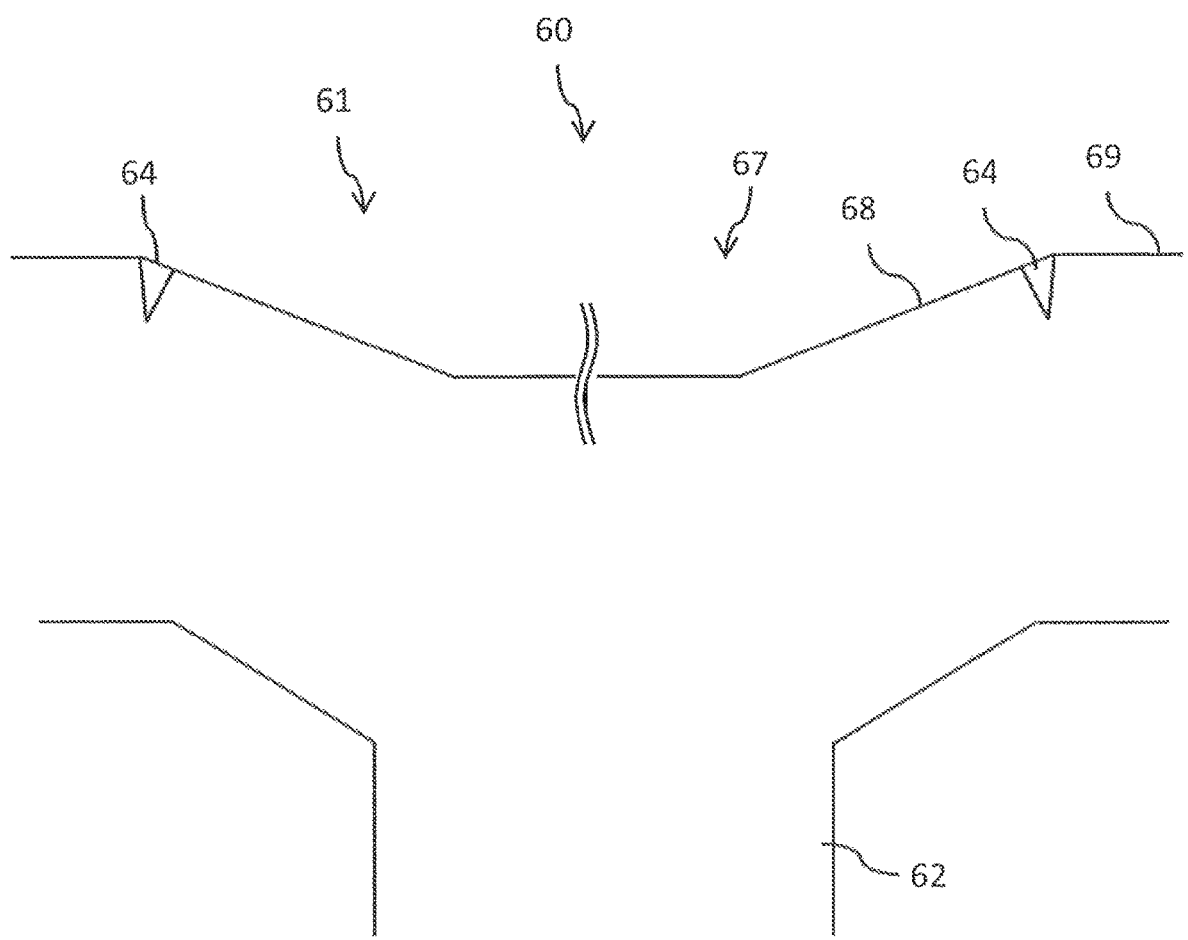
FIG. 5 is a longitudinal sectional view of the first connector that can be used in the first embodiment of the present invention, emphatically showing a first concave part.

As shown in FIG. 5, the one-side surface of the first head part 61 may have a first concave part 67 at a position corresponding to the first columnar part 62, and first groove part 64 may be provided in the circumferential part of the first concave part 67. Note that the present invention is not limited to such an aspect, and the first groove part 64 may be provided outside the circumference of the first concave part 67 as in the second embodiment (to be described later) or may be provided inside the circumference of the first concave part 67 as in the third embodiment. Being provided with "a first concave part 67 at a position corresponding to the first columnar part 62" means that the first concave part 67 is provided at the position where the first columnar part 62 is provided when viewed along the first direction.

The one-side surface of the first connector 60 may have a first inclined surface 68 and a first flat surface 69 provided outside the circumference of the first inclined surface 68. The first groove part 64 may be provided at the boundary between the first inclined surface 68 and the first flat surface 69. The first flat surface 69 need not necessarily completely extend along the planar direction. The first flat surface 69 in this embodiment is a surface that is positioned outside the circumference of the first inclined surface 68 and smaller in inclination angle with respect to a plane including the second and third directions than the first inclined surface 68. Note that the first inclined surface 68 is included in the first concave part 67, and the circumferential part of the first concave part 67 corresponds to the boundary between the first inclined surface 68 and the first flat surface 69. In addition, the first groove part 64 may be provided at the "boundary" between the first inclined surface 68 and the first flat surface 69 such that part of the first groove part 64 is positioned at the boundary. Furthermore, the first groove part 64 may be mostly positioned in the first inclined surface 68 as shown in FIG. 5 or may be mostly positioned in the first flat surface 69 as shown in FIG. 8(c).

Figure 6:
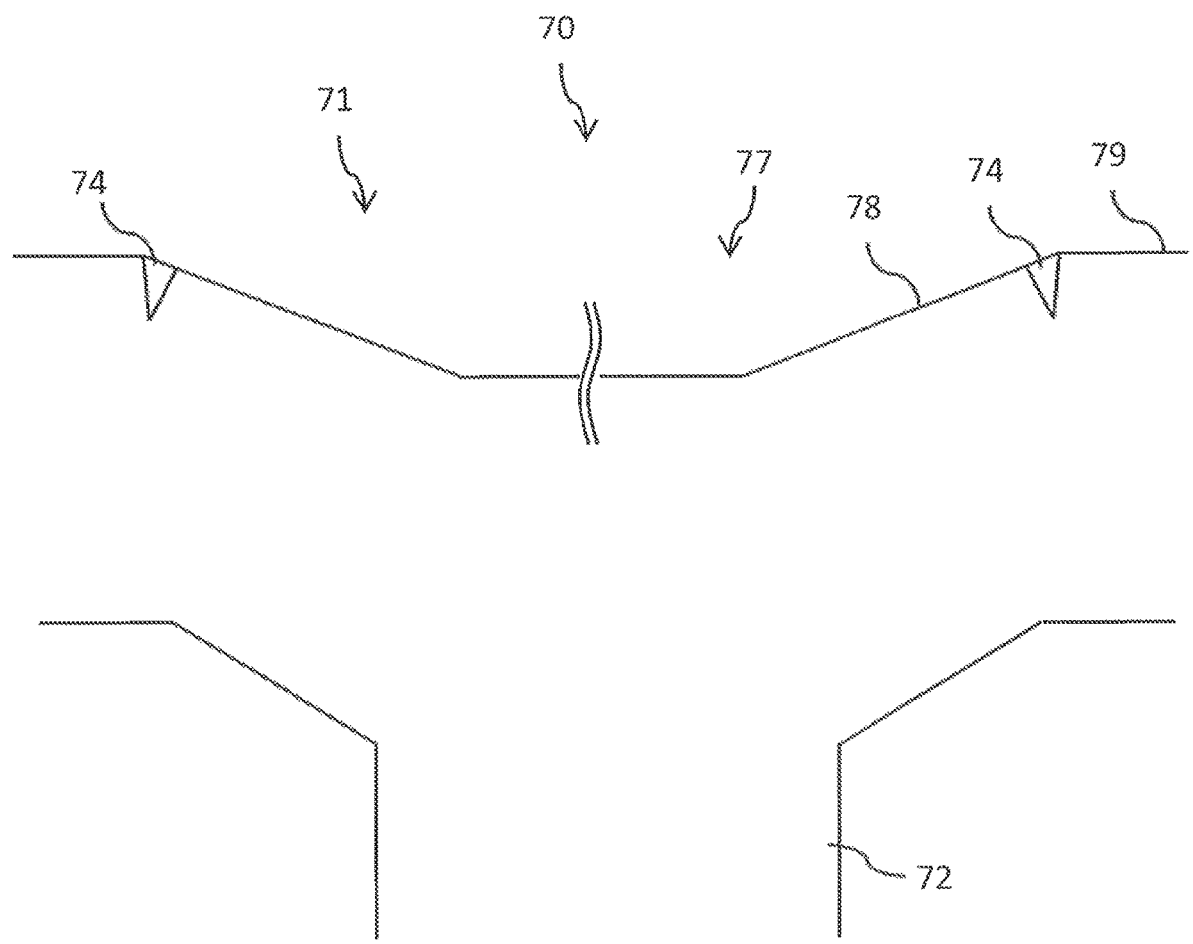
FIG. 6 is a longitudinal sectional view of the second connector that can be used in the first embodiment of the present invention, emphatically showing a second concave part.

As shown in FIG. 6, the one-side surface of the second head part 71 may have a second concave part 77 at a position corresponding to the second columnar part 72, and the second groove part 74 may be provided in the circumferential part of the second concave part 77. Note that the first embodiment is not limited to such an aspect, and the second groove part 74 may be provided outside the circumference of the second concave part 77, as in the second embodiment described later, or may be provided inside the circumference of the second concave part 77, as in the third embodiment. Proving "a second concave part 77 at a position corresponding to the second columnar part 72" means that the second concave part 77 is provided at the position where the second columnar part 72 is provided when viewed along the first direction.

The one-side surface of the second connector 70 may have a second inclined surface 78 and a second flat surface 79 provided outside the circumference of the second inclined surface 78. The second groove part 74 may be provided at the boundary between the second inclined surface 78 and the second flat surface 79. The second flat surface 79 need not necessarily completely extend along the planar direction. The second flat surface 79 in this embodiment is a surface that is positioned outside the circumference of the second inclined surface 78 and smaller in inclination angle with respect to a plane including the second and third directions than the second inclined surface 78. Note that the second inclined surface 78 is included in the second concave part 77, and the circumferential part of the second concave part 77 corresponds to the boundary between the second inclined surface 78 and the second flat surface 79. In addition, the second groove part 74 may be provided at the "boundary" between the second inclined surface 78 and the second flat surface 79 such that part of the second groove part 74 is positioned at the boundary. Furthermore, the second groove part 74 may be mostly positioned in the second inclined surface 78 as shown in FIG. 6 or may be mostly positioned in the second flat surface 79 as shown in FIG. 8(c).

Figure 7:
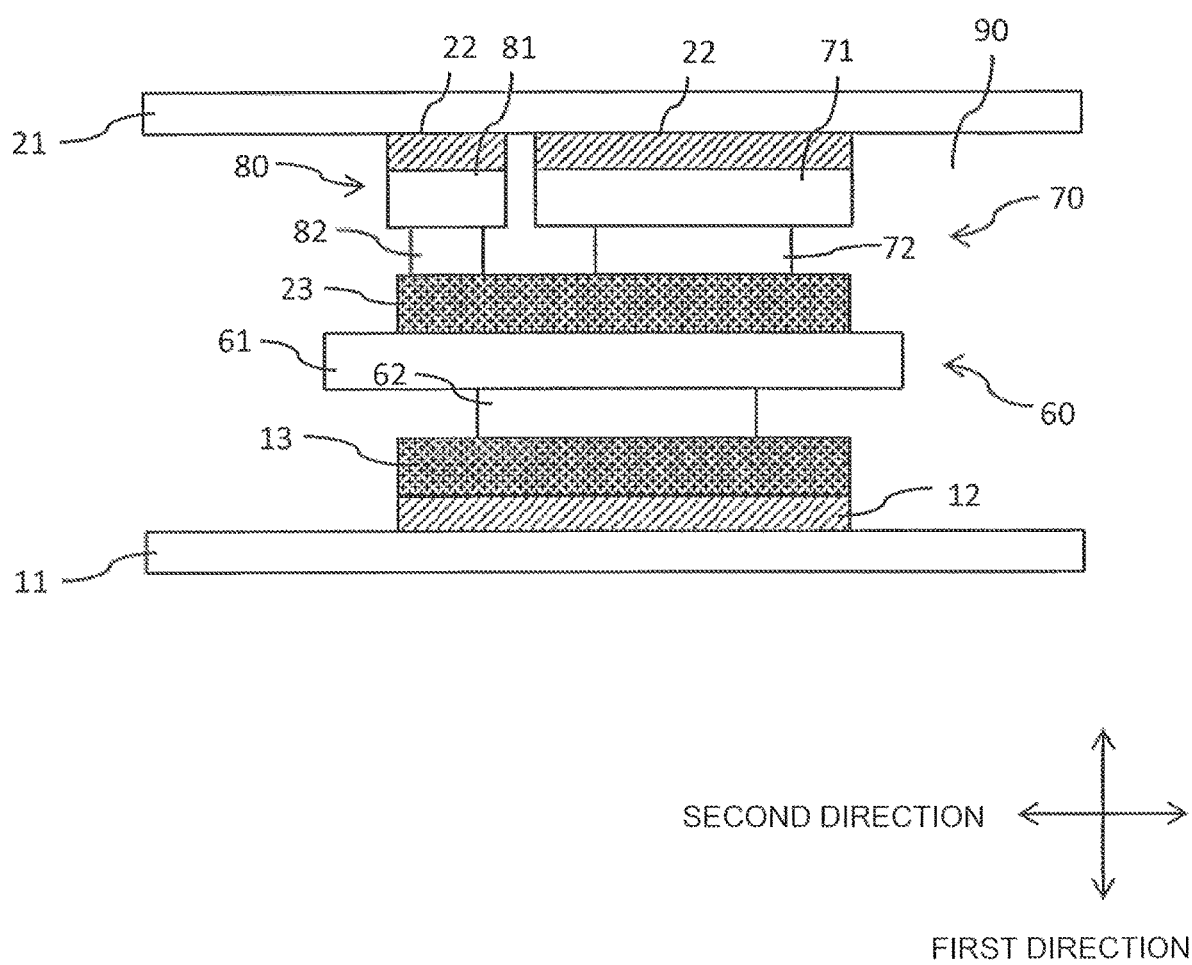
FIG. 7 is a longitudinal sectional view taken along a section different from that of FIG. 1, showing the electronic module that can be used in the first embodiment of the present invention.

As shown in FIG. 7, a third connector 80 may be provided in one side of the second electronic element 23. The third connector 80 may have a third head part 81 and a third columnar part 82 extending from the third head part 81 to another side. The third connector 80 may be connected to the other-side surface of the second conductive layer 22 and the one-side surface of the second electronic element 23 via a conductive adhesive agent such as solder. Note that as the third connector 80, a general connection element 85 (see FIG. 18) may be used instead of a connector having the third columnar part 82 and a nearly T-shaped cross-section.

As shown in FIG. 2, the first electronic element 13 may be formed so as to be exposed outside from the first head part 61 in planar view. If the first electronic element 13 is a switching element such as a MOSFET, a first gate terminal 13g or the like may be provided on a part exposed to the outside. Likewise, if the second electronic element 23 is a switching element such as a MOSFET, a second gate terminal 23g or the like may be provided on the one-side surface. The first electronic element 13 shown in FIG. 2 has the first gate terminal 13g and a first source terminal 13s on the one-side surface, and the second electronic element 23 has the second gate terminal 23g and a second source terminal 23s on the one-side surface. In this case, the second connector 70 may be connected to the second source terminal 23s of the second electronic element 23 via a conductive adhesive agent, and the third connector 80 may be connected to the second gate terminal 23g of the second electronic element 23 via a conductive adhesive agent. In addition, the first connector 60 may connect the first source terminal 13s of the first electronic element 13 to the second drain terminal provided on another side of the second electronic element 23 via a conductive adhesive agent. The first drain terminal provided on another side of the first electronic element 13 may be connected to the first conductive layer 12 via a conductive adhesive agent. The first gate terminal 13g of the first electronic element 13 may be connected to a fourth connector 95 (for example, a connection element; see FIG. 19) via a conductive adhesive agent. The fourth connector 95 may be connected to the first conductive layer 12 via a conductive adhesive agent.

If only one of the first electronic element 13 and the second electronic element 23 is a switching element, it is also conceivable that the second electronic element 23 mounted on the first connector 60 may be a pyrogenic control element, and the first electronic element 13 may be switching element. In contrast to this, it is also conceivable that the second electronic element 23 mounted on the first connector 60 may be a switching element, and the first electronic element 13 may be a pyrogenic control element.

The electronic module may have the first electronic element 13, the second electronic element 23, the first connector 60, the second connector 70, the third connector 80, the fourth connector 95, and a sealing part 90 made of a sealing resin that seals the first conductive layer 12 and the second conductive layer 22 (see FIG. 1).

The first conductive layer 12 may be connected to a terminal part (not shown), and the distal end side of the terminal part may be exposed outside the sealing part 90.

The first electronic element 13, the second electronic element 23, the first connector 60, the second connector 70, the third connector 80, and the fourth connector 95 may constitute a chip module. In this case, an electronic module may be manufactured by arranging the chip module having the first electronic element 13, the second electronic element 23, the first connector 60, the second connector 70, the third connector 80, and the fourth connector 95 between the first substrate 11 provided with the first conductive layer 12 and the second substrate 21 provided with the second conductive layer 22 and then sealing them with the sealing part 90.

As the first substrate 11 and the second substrate 21, ceramic substrates, insulating resin layers, or the like can be adopted. As a conductive adhesive agent, a material containing Ag or Cu as a main component can be used instead of solder. As a material for the first connector 60 and the second connector 70, a metal such as Cu can be used. Note that as the substrates 11 and 21, for example, metal substrates with circuit patterning can be used. In this case, the substrates 11 and 21 also serve as the conductive layers 12 and 22.

In addition to the aspect using a conductive adhesive agent to join the terminal parts to the conductive layers 12 and 22, it is possible to use laser welding or ultrasonic joining.

<<Manufacturing Method>>

An example of a method of manufacturing the first connector 60 according to this embodiment will be described.

First, a conductive plate 300 is mounted in a mold 400 having a mold concave part 410 (the first mounting step; see FIG. 8(a)).

Next, the conductive plate 300 is pressed against the mold 400 with a pressing member or the like to form the first columnar part 62 corresponding to the mold concave part 410 on another side of the conductive plate 300 (the first columnar part forming step; see FIG. 8(b)). In this case, the conductive plate 300 is bent toward the mold concave part 410 to form the first concave part 67 at a position corresponding to the first columnar part 62 on one side of the conductive plate 300. Note that FIGS. 8(b) and 8(c) each exaggeratingly show the manner in which the conductive plate 300 is bent.

Next, a pressing member 450 having a protruding part 460 is pressed against one side of the conductive plate 300 to form the first groove part 64 in the one-side surface of the conductive plate 300 (the first groove part forming step; see FIG. 8(c)). Performing such a pressing operation corrects the bend of the conductive plate 300 at the circumferential part toward the mold concave part 410 and nearly flattens the corresponding part, thereby forming the first flat surface 69.

Note that the step of forming the first flat surface 69 may be performed separately from the step of forming the first groove part 64. For example, after the first flat surface 69 is formed with the pressing member, a member like the protruding part 460 may be pressed against the surface to form the first groove part 64. On the contrary, after the first groove part 64 is formed, the first flat surface 69 may be formed.

A method of manufacturing the second connector 70 according to this embodiment will be described next. This method is basically the same as the method of manufacturing the first connector 60, and hence will be described with reference to FIG. 8.

First, the conductive plate 300 is mounted in the mold having the mold concave part 410 (the second mounting step; see FIG. 8(a)).

Next, the conductive plate 300 is pressed against the mold to form the second columnar part 72 corresponding to the mold concave part 410 in the other side of the conductive plate 300 (the second columnar part forming step; see FIG. 8(b)). In this case, the conductive plate 300 is bent toward the mold concave part 410 to form the second concave part 77 at a position corresponding to the second columnar part 72 on one side of the conductive plate 300. Note that FIGS. 8(b) and 8(c) each exaggeratingly show the manner in which the conductive plate 300 is bent.

Next, a pressing member 450 having a protruding part 460 is pressed against one side of the conductive plate 300 to form the second groove part 74 in the one-side surface of the conductive plate 300 (the second groove part forming step; see FIG. 8(c)). Performing such a pressing operation corrects the bend of the conductive plate 300 toward the mold concave part 410 and nearly flattens the corresponding part, thereby forming the second flat surface 79.

Note that the step of forming the second flat surface 79 may be performed separately from the step of forming the second groove part 74. For example, after the second flat surface 79 is formed with the pressing member, a member like the protruding part 460 may be pressed against the surface to form the second groove part 74. On the contrary, after the second groove part 74 is formed, the second flat surface 79 may be formed.

An example of a method of manufacturing an electronic module according to this embodiment will be described next. As the first connector 60 and the second connector 70 used in this case, the connectors manufactured in the above manufacturing processes can be used.

Figure 9:
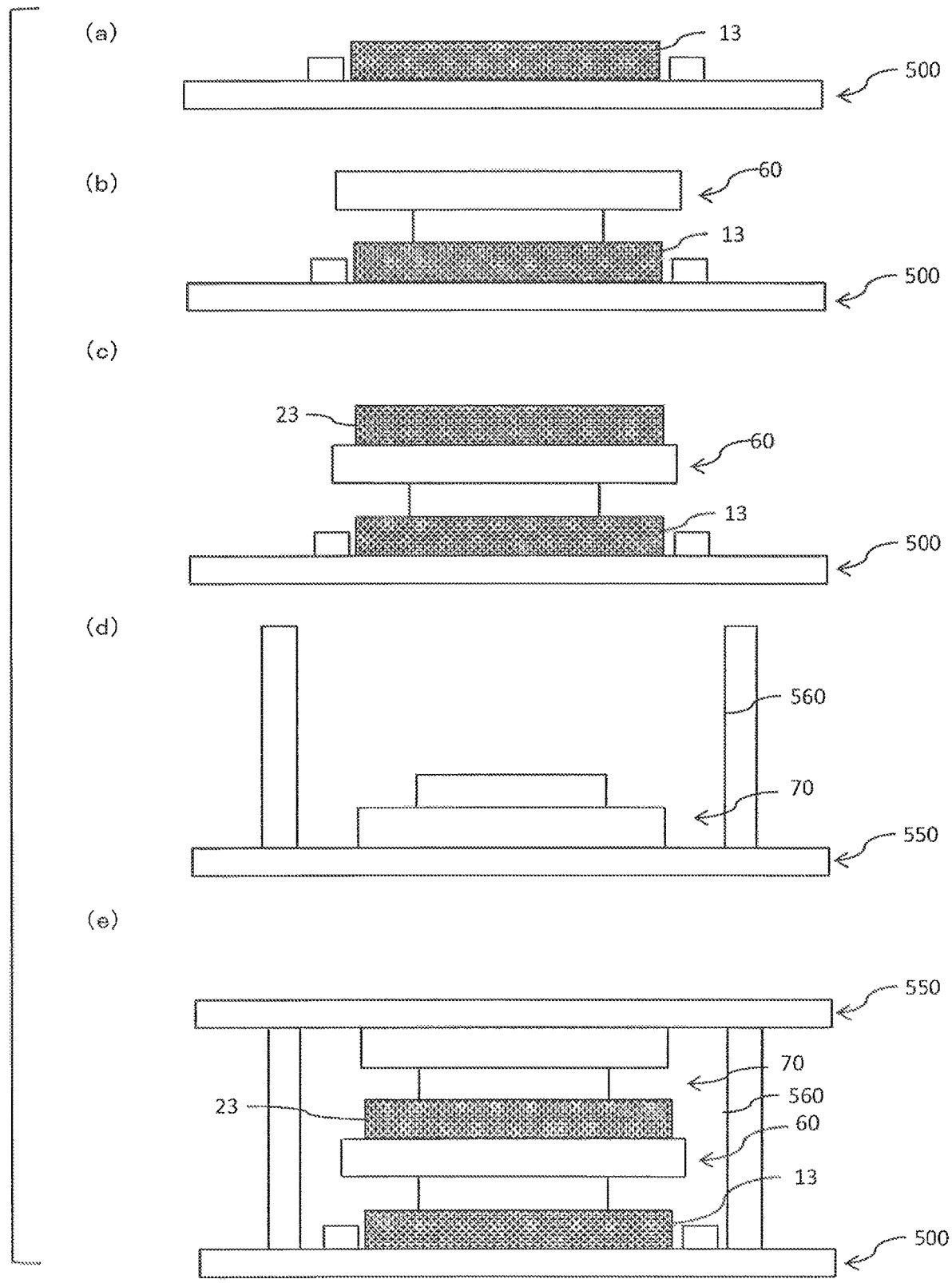
FIGS. 9(a) to 9(e) are longitudinal sectional views showing a manufacturing process for a chip module that can be used in the first embodiment of the present invention.

First, the first electronic element 13 is placed on a first jig 500 (the first electronic element placing step; see FIG. 9'(a)).

Next, the first connector 60 is placed on the first electronic element 13 via a conductive adhesive agent such as solder (the first connector placing step; see FIG. 9(*b*)). Note that FIG. 9 does not show the conductive adhesive agent such as solder.

Next, the second electronic element 23 is placed on the first connector 60 via a conductive adhesive agent (the second electronic element placing step; see FIG. 9(*c*)). Note that the conductive adhesive agent on the first connector 60 is placed inside the circumference of the first groove part 64 of the first electronic element 13.

The second connector 70 is placed on a second jig 550 (the second electronic element placing step; see FIG. 9(*d*)). The second jig 550 may have a plurality of jig concave parts 560 at the position where the second connector 70 is placed. The jig concave part 560 may have a height corresponding to the height of a chip module. That the height of the jig concave part 560 corresponds to the height of the chip module means that the jig concave part 560 has a height equal to or more than the overall design height of the chip module when consideration is also given to the thickness of the conductive adhesive agent.

The second jig 550 is inverted while the second connector 70 is chucked to the second jig 550 by using a suction member or the like, and the second connector 70 is placed on the second electronic element 23 via a conductive adhesive agent (the inverting/placing step; see FIG. 9(*e*)).

Next, the conductive adhesive agent is cured (the curing step). A chip module having the first electronic element 13 and the second electronic element 23 is manufactured in this manner.

Note that when the first electronic element 13 and the second electronic element 23 are sealed in the sealing part 90 such as a sealing resin, the chip module is placed between the first substrate 11 and the second substrate 21, and the sealing part 90 such as a sealing resin is injected between the first substrate 11 and the second substrate 21, thereby manufacturing an electronic module according to this embodiment.

<<Function/Effect>>

An example of the function/effect implemented by this embodiment having the above arrangement will be described nest. Note that all aspects described concerning "function/effect" can be used for the above arrangements.

Figure 3:
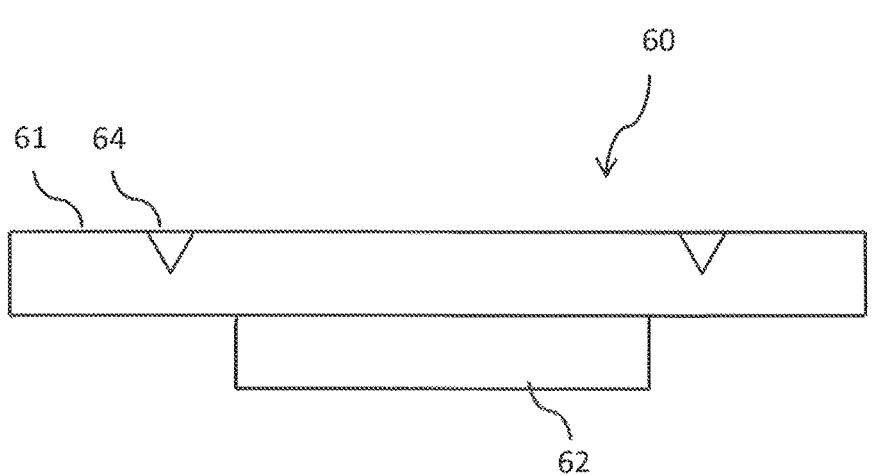
FIG. 3(a) is a longitudinal sectional view of a first connector that can be used in the first embodiment of the present invention.
FIG. 3(b) is a longitudinal sectional view of another first connector that can be used in the first embodiment of the present invention.
Figure 3:
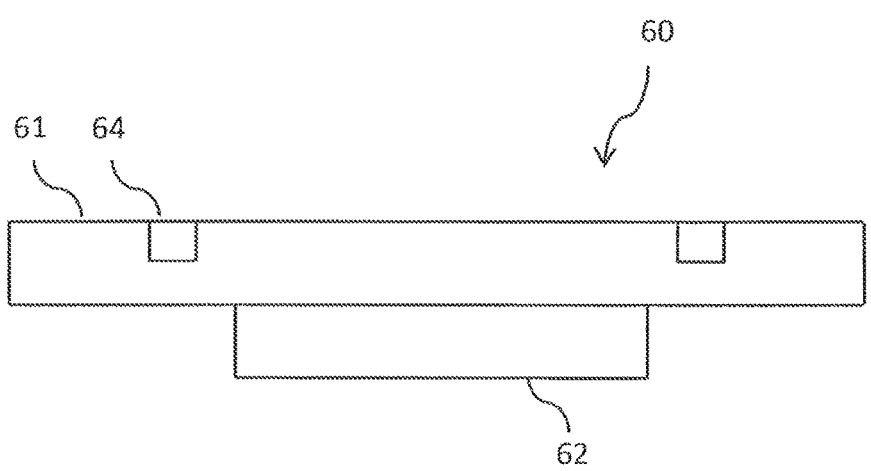

As shown in FIG. 3, adopting an aspect in which the first groove part 64 is provided in the one-side surface of the first head part 61 can prevent the conductive adhesive agent from spreading outward from the first groove part 64 when the conductive adhesive agent is melted.

Figure 8:
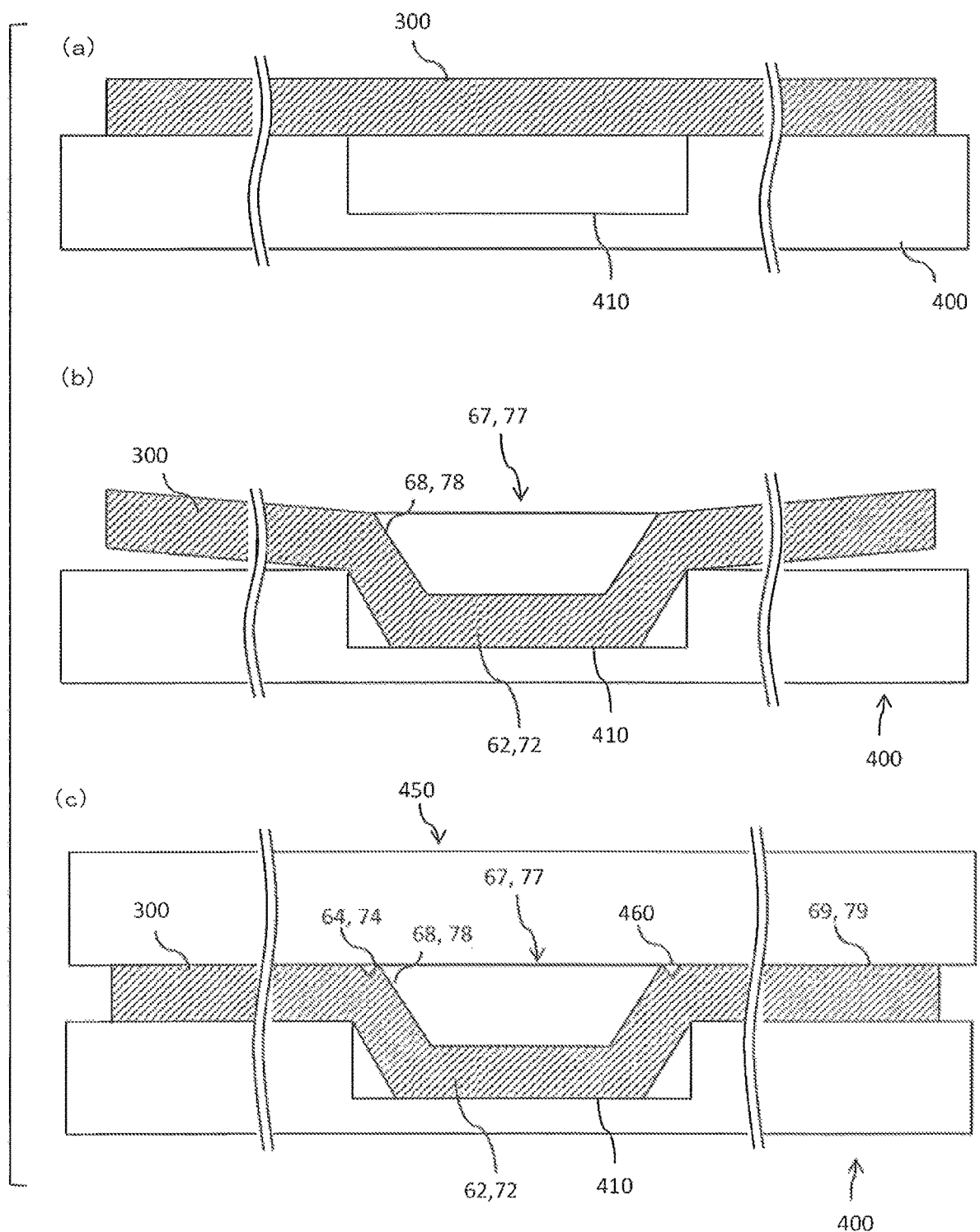

As described concerning the manufacturing processes described above, the conductive plate 300 bends when the first columnar part 62 is formed, and the first groove part 64 is formed by correcting the bend as shown in FIG. 8(*c*). In this embodiment, the first concave part 67 and the first flat surface 69 are formed, with the first groove part 64 serving as a boundary. Adopting such an aspect is beneficial in terms of holding the conductive adhesive agent within the first concave part 67 when the conductive adhesive agent is melted and reliably providing the first flat surface 69 outside the circumference. Holding the conductive adhesive agent within the first concave part 67 is beneficial in terms of ensuring the thickness of the conductive adhesive agent. In addition, providing the first flat surface 69 makes it possible to palace the second electronic element 23 along the planar direction of the first flat surface 69. Accordingly, this aspect is also beneficial in terms of making it difficult to impose stress from the first connector 60 onto the second electronic element 23.

Adopting the aspect in which the first groove part 64 is provided outside the entire circumference of the first columnar part 62 in planar view (planar direction) will reliably prevent a conductive adhesive agent from flowing outward from the circumference when the conductive adhesive agent is melted.

Note that when the aspect in which the first connector 60 has the first columnar part 62 is adopted, the first electronic element 13 can be separated to some degree from the second electronic element 23 to escape heat. That is, this aspect is also beneficial in this regard. In this embodiment, it is also possible to form the first concave part 67 by forming the first columnar part 62 in this manner. As a result, the melted conductive adhesive agent remains in the first concave part 67, and hence this aspect is also beneficial in terms of preventing the melted conductive adhesive agent from flowing outward from the circumference.

The similar description as that of the first connector 60 applies to the second connector 70. As described concerning the manufacturing processes, the conductive plate 300 bends when the second columnar part 72 is formed. As shown in FIG. 8(*c*), when this bend is corrected, the second groove part 74 is formed. In this embodiment, the second concave part 77 and the second flat surface 79 are formed, with the second groove part 74 serving as a boundary. Adopting such an aspect is beneficial in terms of holding the conductive adhesive agent within the second concave part 77 when the conductive adhesive agent is melted and reliably providing the second flat surface 79 outside the circumference.

Adopting the aspect in which the second connector 70 has the second columnar part 72 extending from the second head part 71 to the other side can provide a space in one side of the second electronic element 23 and prevent heat generated from the second electronic element 23 from being confined. In this embodiment, the second concave part 77 can also be formed by forming the second columnar part 72 in this manner. As a result, the melted conductive adhesive agent remains in the second concave part 77, and hence this aspect is also beneficial in terms of preventing the melted conductive adhesive agent from flowing outward from the circumference.

Adopting the aspect in which the second groove part 74 is provided outside the entire circumference of the second columnar part 72 in planar view (planar direction) will reliably prevent a conductive adhesive agent from flowing outward from the circumference when the conductive adhesive agent is melted.

When the first groove part 64 has a rectangular cross-section as shown in FIG. 3(*b*), the angle formed by the surface of the first groove part 64 and the surface of the first concave part 67 can be set to about 90°, and the surface tension with respect to a conductive adhesive agent can be increased. This can make it difficult for the conductive adhesive agent to flow into the first concave part 67. Likewise, when the second groove part 74 has a rectangular cross-section as shown in FIG. 4(*b*), the angle formed by the surface of the second groove part 74 and the surface of the second concave part 77 can be set to about 90°, and the surface tension with respect to a conductive adhesive agent can be increased. This can make it difficult for the conductive adhesive agent to flow into the second concave part 77.

Forming the first groove part 64 having a triangular cross-section as shown in FIG. 3(*a*) is beneficial in terms of relatively easily forming the first groove part 64 and easily forming the first flat surface 69. Likewise, forming the second groove part 74 having a triangular cross-section as shown in FIG. 4(*a*) is beneficial in terms of relatively easily forming the second groove part 74 and easily forming the second flat surface 79.

When the first flat surface 69 is inclined so as to separate from a plane including the second and third directions toward one side as the first flat surface 69 is inclined toward the outside of the circumference, it is possible to prevent the melted conductive adhesive agent from flowing outward from the circumference of the first connector 60 even as the first flat surface 69 is inclined.

This structure is beneficial in this respect. Likewise, when the second flat surface 79 is inclined so as to separate from a plane including the second and third directions toward one side as the second flat surface 79 is inclined toward the outside of the circumference, it is possible to prevent the melted conductive adhesive agent from flowing outward from the circumference of the second connector 70 even as the second flat surface 79 is inclined. This structure is beneficial in this respect.

Second Embodiment

The second embodiment of the present invention will be described next.

Figure 10:
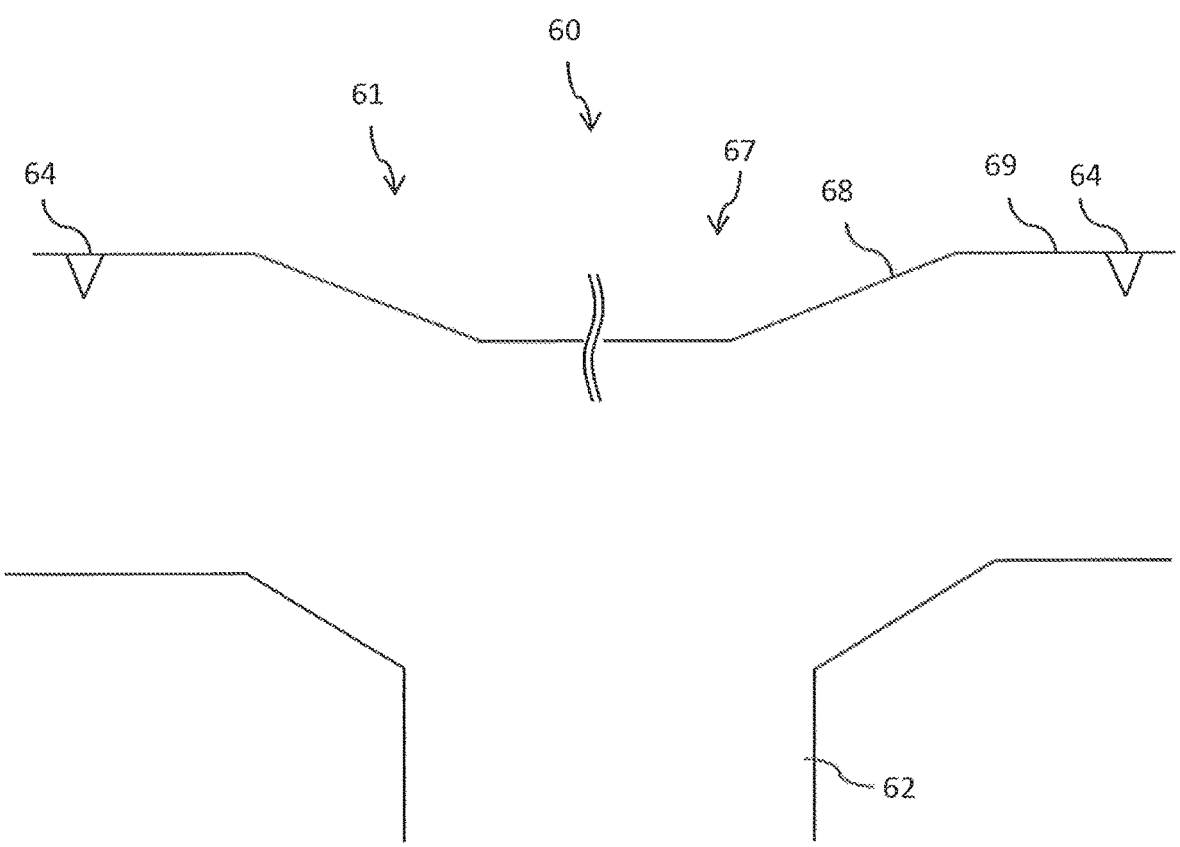
FIG. 10 is a longitudinal sectional view of a first connector that can be used in the second embodiment of the present invention, emphatically showing a first concave part.
Figure 11:
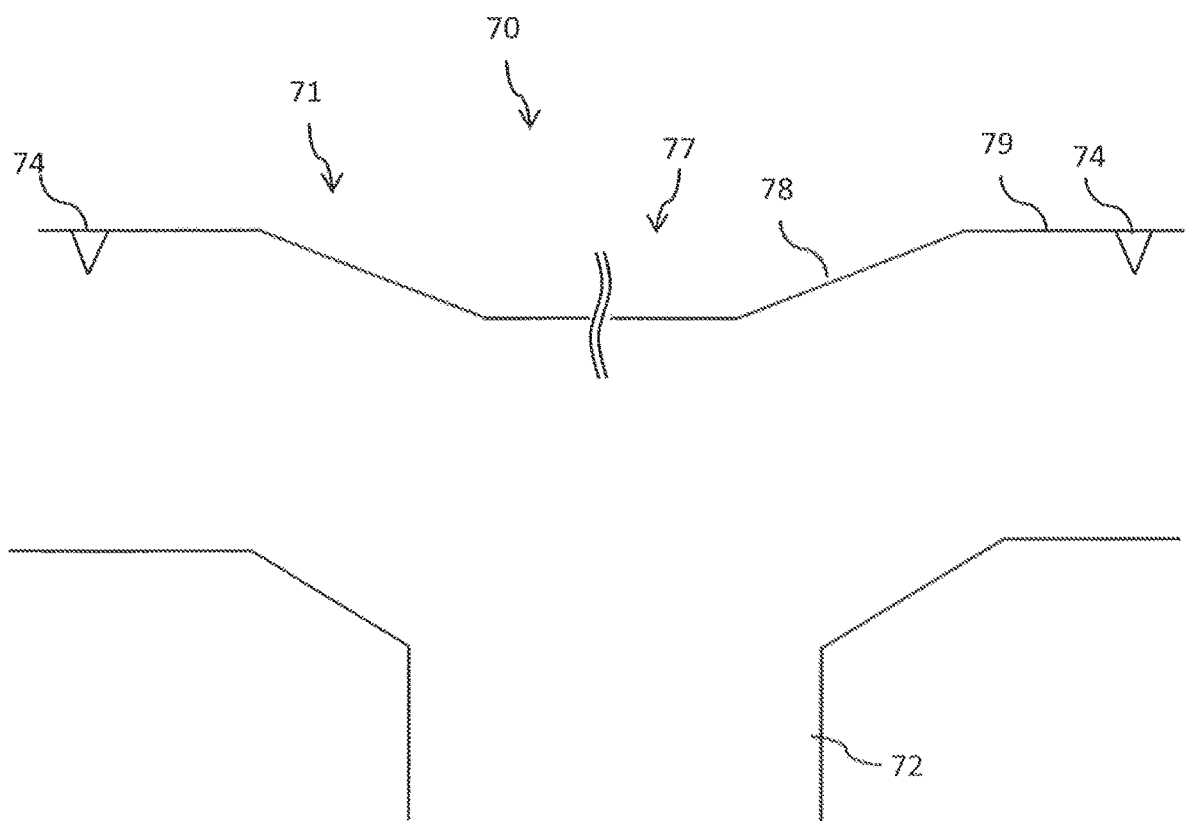
FIG. 11 is a longitudinal sectional view of a second connector that can be used in the second embodiment of the present invention, emphatically showing a second concave part.
Figure 12:
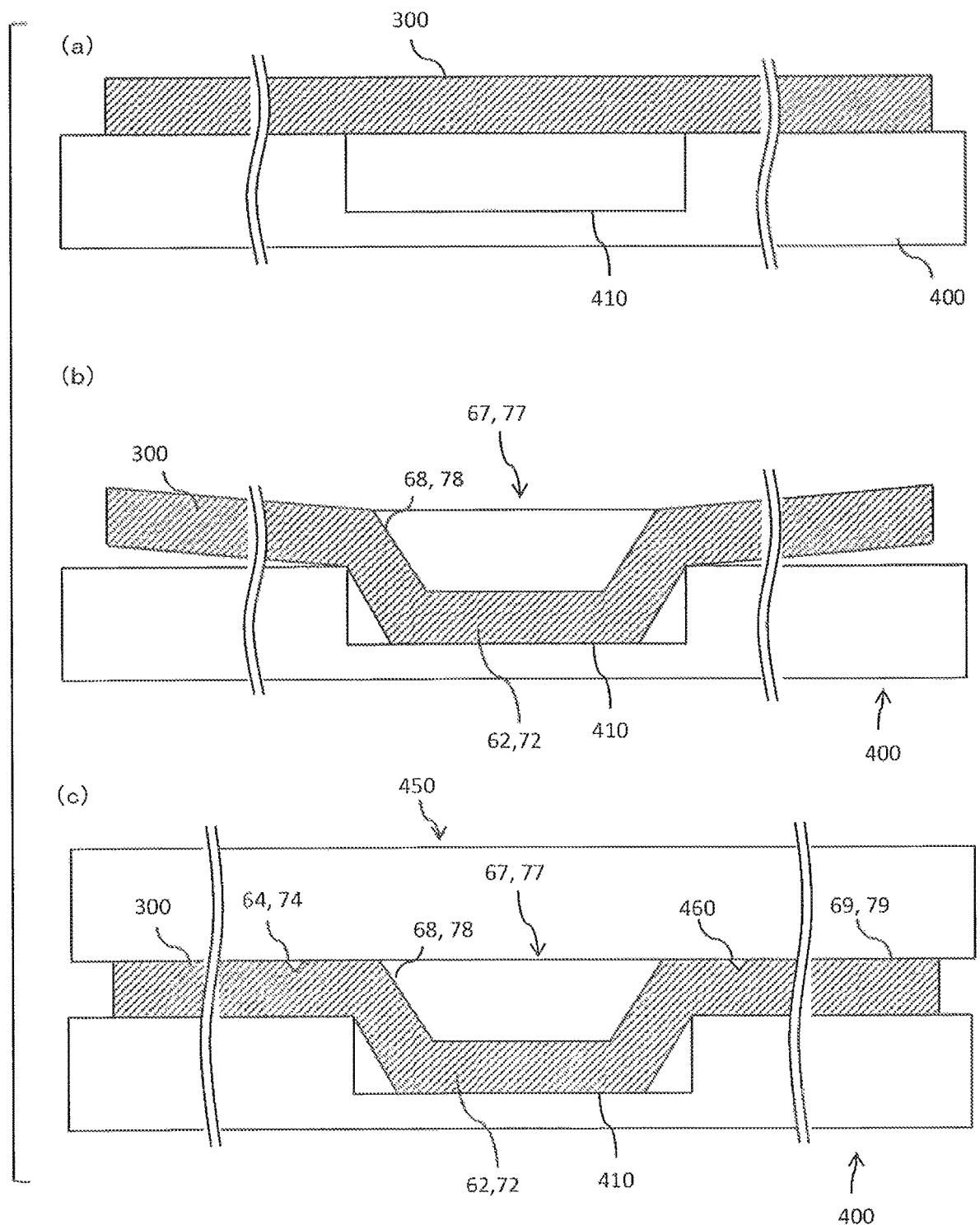

The first embodiment has exemplified the aspect in which the first groove part 64 is provided at the boundary between the first inclined surface 68 and the first flat surface 69, and the second groove part 74 is provided at the boundary between the second inclined surface 78 and the second flat surface 79. However, in the present embodiment, as shown in FIGS. 10 to 12, a first groove part 64 is provided outside the circumference of a first concave part 67 and is provided in a first flat surface 69, and a second groove part 74 is provided outside the circumference of a second concave part 77 and is provided in a second flat surface 79. The other constituent elements are the same as those of the first embodiment, and any aspects described in the first embodiment can be adopted. The same reference numerals denote the same members as those described in the first embodiment.

As in this embodiment, in order to provide the first groove part 64 in the first flat surface 69 and provide the second groove part 74 in the second flat surface 79, a protruding part 460 is located further outside the circumferential part of the mold concave part 410 compared to the aspect described in the first embodiment (see FIG. 12(*c*)).

Adopting the aspect in which the first groove part 64 is provided outside the circumference of the first concave part 67 and is provided in the first flat surface 69 as in this embodiment is beneficial in terms of making the first concave part 67 prevent a melted conductive adhesive agent from spreading outside the circumference and also making the first groove part 64 prevent the conductive adhesive agent, even if it flows outside the circumference of the first concave part 67, from spreading outside the circumference.

Likewise, adopting the aspect in which the second groove part 74 is provided outside the circumference of the second concave part 77 and is provided in the second flat surface 79 is beneficial in terms of making the second concave part 77 prevent a melted conductive adhesive agent from spreading outside the circumference and also making the second groove part 74 prevent the conductive adhesive agent, even if it flows outside the circumference of the second concave part 77, from spreading outside the circumference.

Third Embodiment

The third embodiment of the present invention will be described next.

Unlike in the first and second embodiments, in the present embodiment, a first groove part 64 is provided in a first inclined surface 68, and a second groove part 74 is provided in a second inclined surface 78. With regard to other constituent elements, any aspects described in the respective embodiments can be adopted. The same reference numerals denote the same members as those described in the respective embodiments.

As in the present embodiment, adopting the aspect in which the first groove part 64 is provided in the first inclined surface 68 is beneficial in terms of preventing, per se, a conductive adhesive agent from flowing out from a first concave part 67. Likewise, adopting the aspect in which the second groove part 74 is provided in the second inclined surface 78 is beneficial in terms of preventing, per se, a conductive adhesive agent from flowing out from a second concave part 77.

Figure 13:
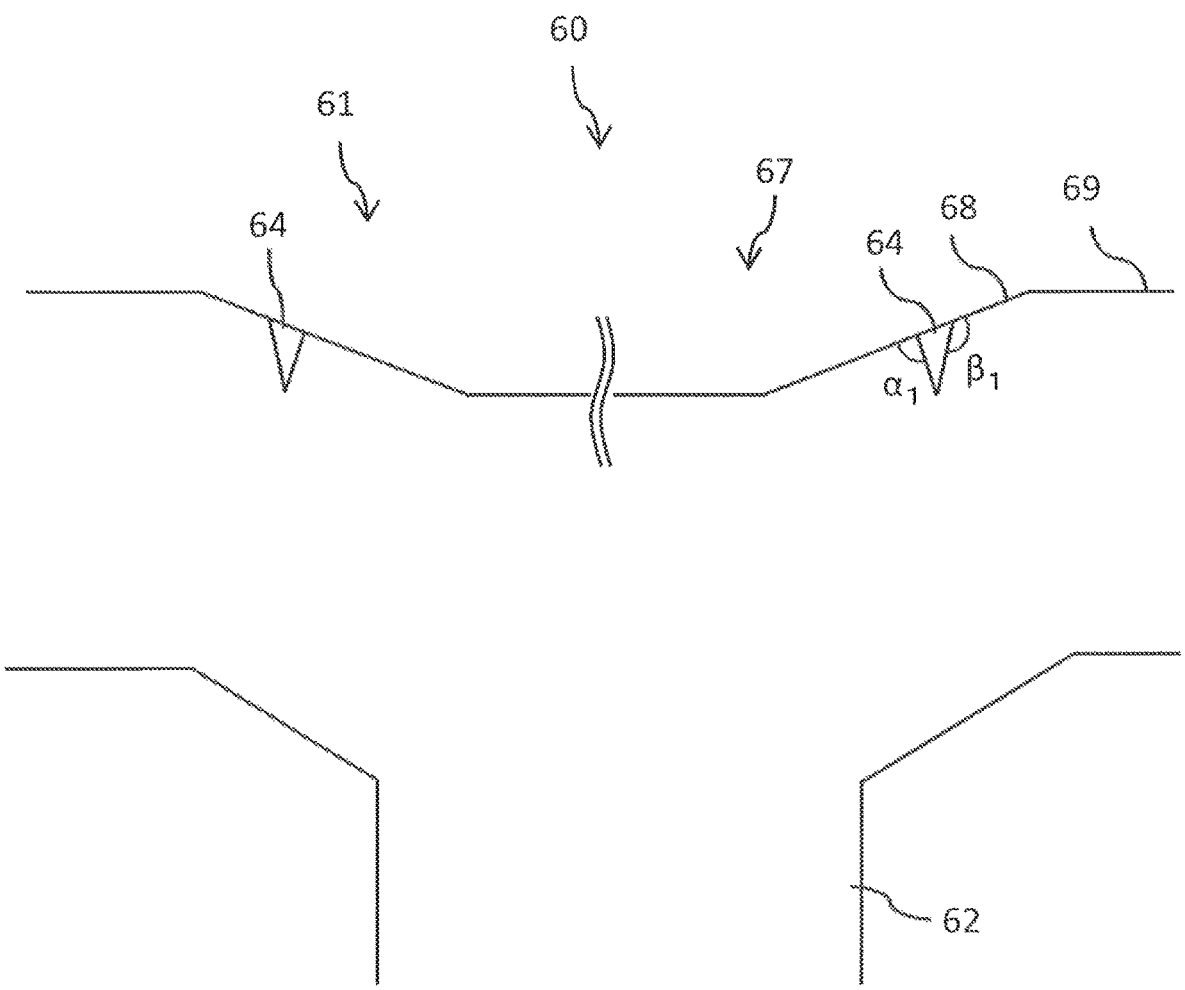
FIG. 13 is a longitudinal sectional view of a first connector that can be used in the third embodiment of the present invention, emphatically showing a first concave part.

When viewed in longitudinal cross-section, as shown in FIG. 13, an angle $\alpha_1$ formed by the first inclined surface 68 and the surface, which is in an inner peripheral side, of the first groove part 64 may be smaller than an angle $\beta_1$ formed by the first inclined surface 68 and the surface, which is in an outer peripheral side, of the first groove part 64. In this case, it is possible to reduce the angle formed between the first inclined surface 68 and the surface, which is in the inner peripheral side, of the first groove part 64 and increase the surface tension of a conductive adhesive agent. This is beneficial in terms of making it difficult for the conductive adhesive agent to flow into the first groove part 64, and hence making it possible to prevent the conductive adhesive agent from spreading outside the circumference.

Figure 14:
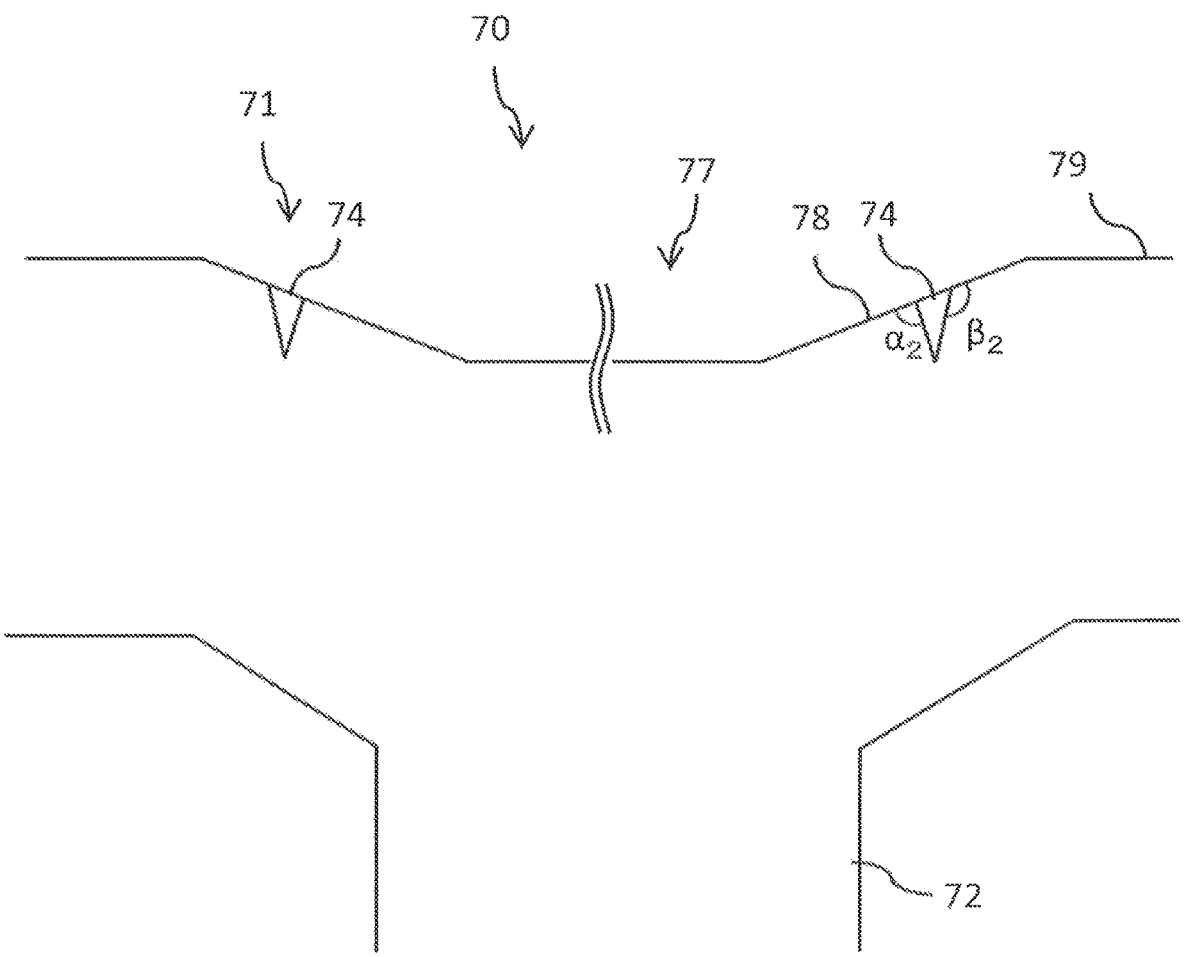
FIG. 14 is a longitudinal sectional view of a second connector that can be used in the third embodiment of the present invention, emphatically showing a second concave part.
Figure 15:
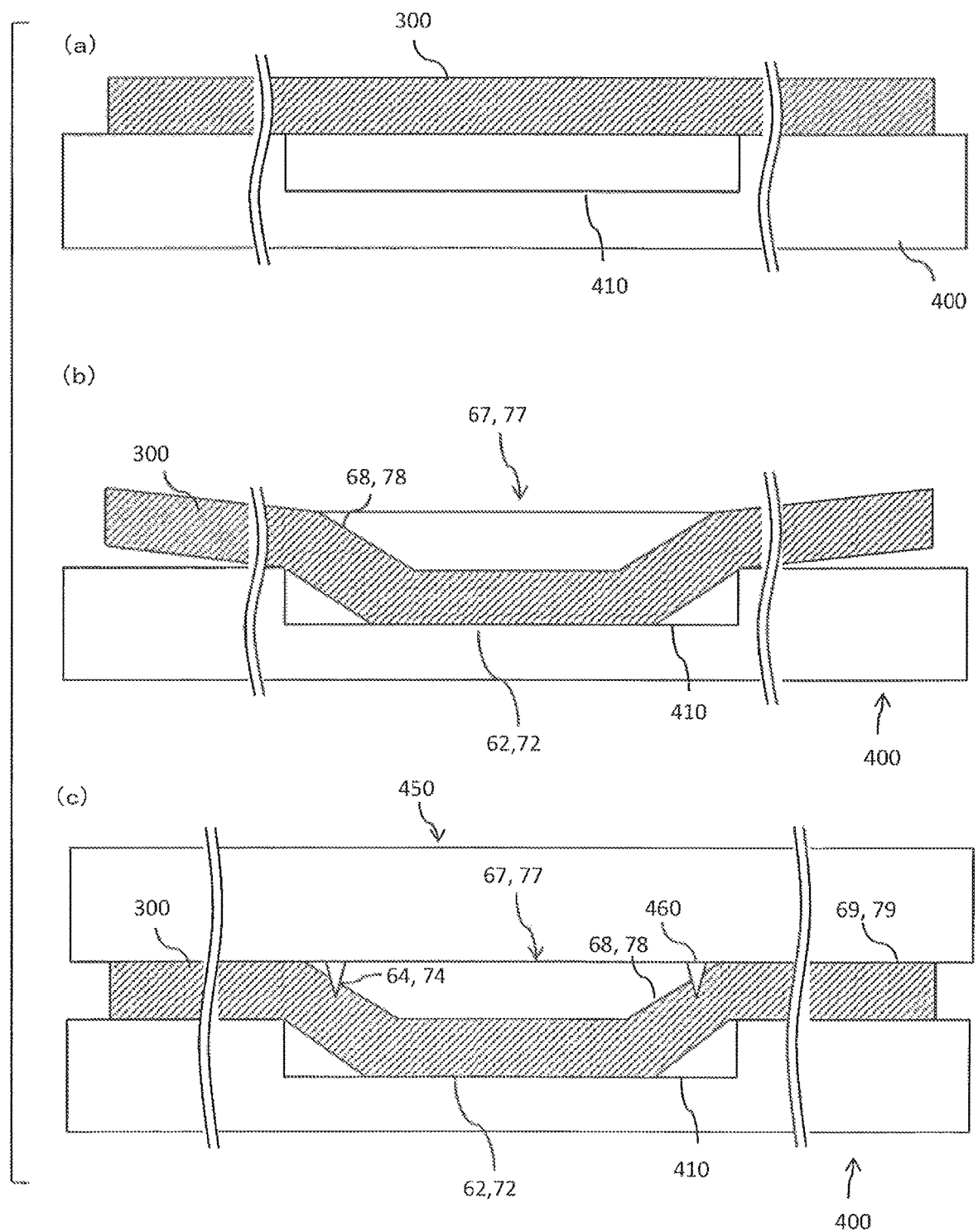

When viewed in longitudinal cross-section, as shown in FIG. 14, an angle $\alpha_2$ formed by the second inclined surface 78 and the surface, which is in an inner peripheral side, of the second groove part 74 is smaller than the angle formed by the first inclined surface 68 and the surface, which is in an outer peripheral side, of the second groove part 74. In this case, it is possible to reduce the angle formed between the second inclined surface 78 and the surface, which is in the inner peripheral side, of the second groove part 74 and increase the surface tension of a conductive adhesive agent. This is beneficial in terms of making it difficult for the conductive adhesive agent to flow into the second groove part 74, and hence making it possible to prevent the conductive adhesive agent from spreading outside the circumference.

Note that in the first and second embodiments as well, the angle formed by the one-side surface of the first head part 61 (the first flat surface 69 or the first inclined surface 68) and the surface, which is in the inner peripheral side, of the first groove part 64 may be smaller than the angle formed by the one-side surface of the first head part 61 and the surface, which is in the outer peripheral side, of the first groove part 64. In addition, the angle formed by the one-side surface of the second head part 71 (the second flat surface 79 or the second inclined surface 78) and the surface, which is in the inner peripheral side, of the second groove part 74 may be smaller than the angle formed by the one-side surface of the second head part 71 and the surface, which is in the outer peripheral side, of the second groove part 74.

In each embodiment described above, the relationship between the first groove part 64, the first inclined surface 68, and the first flat surface 69 of the first connector 60 is described in the same aspect as that of the relationship between the second groove part 74, the second inclined surface 78, and second flat surface 79 of the second connector 70. However, this is not exhaustive. When, for example, the first connector 60 has the same aspect as that described in the first embodiment, the second connector 70 may have the same aspect as that described in the second embodiment or the third embodiment. In addition, the second connector 70 has the same aspect as that described in the first embodiment, the first connector 60 according to the second embodiment may have the same aspect as that described in the third embodiment. These aspects can be combined arbitrarily.

Fourth Embodiment

The fourth embodiment of the present invention will be described next.

Figure 16:
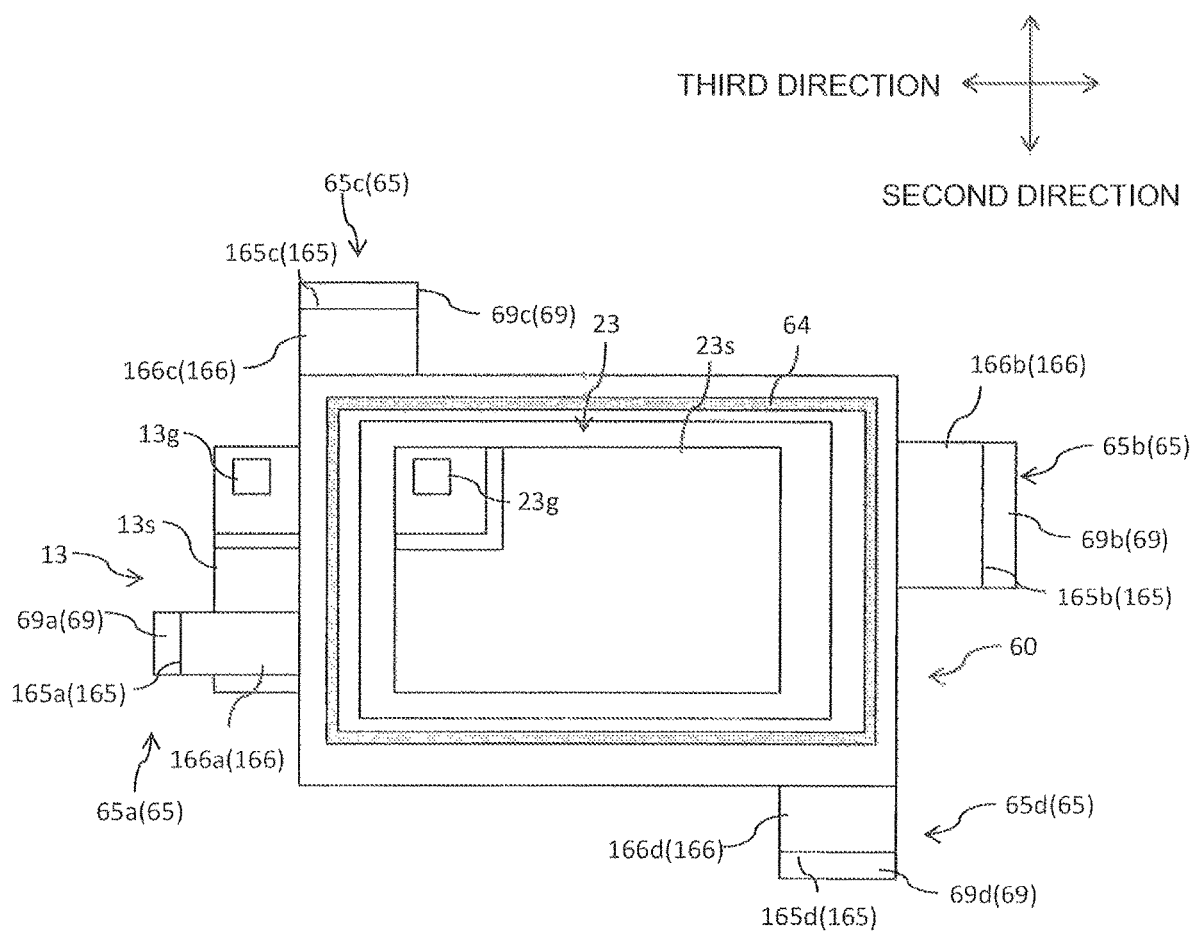
FIG. 16 is a plan view of an electronic module that can be used in the fourth embodiment of the present invention.

Each embodiment described above uses the first connector 60 having a nearly T-shaped cross-section. In contrast, a first connector 60 according to the present embodiment has four support parts 65 (65a to 65d) extending from the first head part 61 to the other side, as shown in FIG. 16. The support body 65 is in contact with the first conductive layer 12 or the first substrate 11. With regard to other constituent elements, any aspects described in the respective embodiments can be adopted. The same reference numerals denote the same members as those described in the respective embodiments.

This embodiment exemplifies an aspect using the four support parts 65, but this is not exhaustive. The embodiment may use one, two, or three or five or more support parts 65.

Proving the support parts 65 extending from the first head part 61 as in this embodiment can prevent the first connector 60 from being inclined by the weight of the second electronic element 23 when or after the second electronic element 23 is mounted. In addition, bringing the support parts 65 into contact with the first substrate 11 or the first conductive layer 12 can improve the heat dissipation performance. Bringing the support parts 65 into contact with the first conductive layer 12, in particular, is beneficial in terms of further improving the heat dissipation effect.

Providing the plurality of support parts 65 as in this embodiment is beneficial in terms of further stabilizing the first connector 60 and achieving a higher heat dissipation effect.

Each support part 65 may have a support proximal end part 69 (69a to 69d) that extends in the planar direction and is in contact with the first substrate 11 or the first conductive layer 12. In addition, each of the plurality of support parts 65 need not be provided with the support proximal end part 69. Instead, some of the plurality of support parts 65 may be provided with the support proximal end parts 69, and the remaining support parts 65 may not be provided with any support proximal end parts 69.

When the support parts 65 are provided with such support proximal end parts 69, the first connector 60 can be placed on the first substrate 11 or the first conductive layer 12 in a better-balanced state. In addition, because the support proximal end parts 69 can increase the contact areas with the first substrate 11 or the first conductive layer 12, the heat dissipation effect can be increased.

Each support part 65 may be in contact with the first conductive layer 12. Adopting the aspect in which the first conductive layer 12 connected to the support part 65 is not electrically connected to another first conductive layer 12, a second conductive layer 22, the first electronic element 13, and the second electronic element 23 and serves no electrical function is beneficial in terms of preventing the first electronic element 13 and the second electronic element 23 from exhibiting unexpected behaviors when the support part 65 is rendered conductive.

When the support parts 65 are used as in this embodiment, it is beneficial that the first head part 61 has the first flat surface 69 located outside the circumference, as shown in FIGS. 5, 10, and 13. When the first head part 61 is inclined along the first direction outside the circumference, the support part 65 may not be reliably brought into contact with the first conductive layer 12 or the first substrate 11. In contrast, when the first head part 61 has the first flat surface 69 outside the circumference, the support part 65 can be reliably brought into contact with the first conductive layer 12 or the first substrate 11. That is, this structure is beneficial in terms of improving the stability achieved by the support part 65 and improving the heat dissipation performance. In this regard, the inclination angle of the first flat surface 69 with respect to the planar direction is preferably small, for example, equal to or less than 3°.

Providing the first groove part 64 is also beneficial in terms of allowing the first flat surface 69 to be reliably extended along the planar direction. Placing the first groove part 64 at the boundary between the first flat surface 69 and the first inclined surface 68 as in the first embodiment is particularly beneficial in terms of reliably reducing the inclination angle of the first flat surface 69 with respect to the planar direction. In addition, providing the first groove part 64 in the first flat surface 69 as in the second embodiment is beneficial in terms of more reliably reducing the inclination angle with respect to the planar direction outside the circumference relative to the first groove part 64.

Each support part 65 may have a planar-direction support part 166 (166a to 166d) extending from the first head part 61 in the planar direction and a height-direction support part 165 (165a to 165d) extending from an end part of the planar-direction support part 166 in the height direction (first direction) (see also the sixth embodiment described later). Note that the planar-direction support part 166 is a part having a shorter length in the widthwise direction than the first head part 61.

The support part 65 may have only the height-direction support part 165 extending from the first head part 61 in the height direction (first direction) without having the planar-direction support part 166.

Fifth Embodiment

The fifth embodiment of the present invention will be described next.

Figure 17:
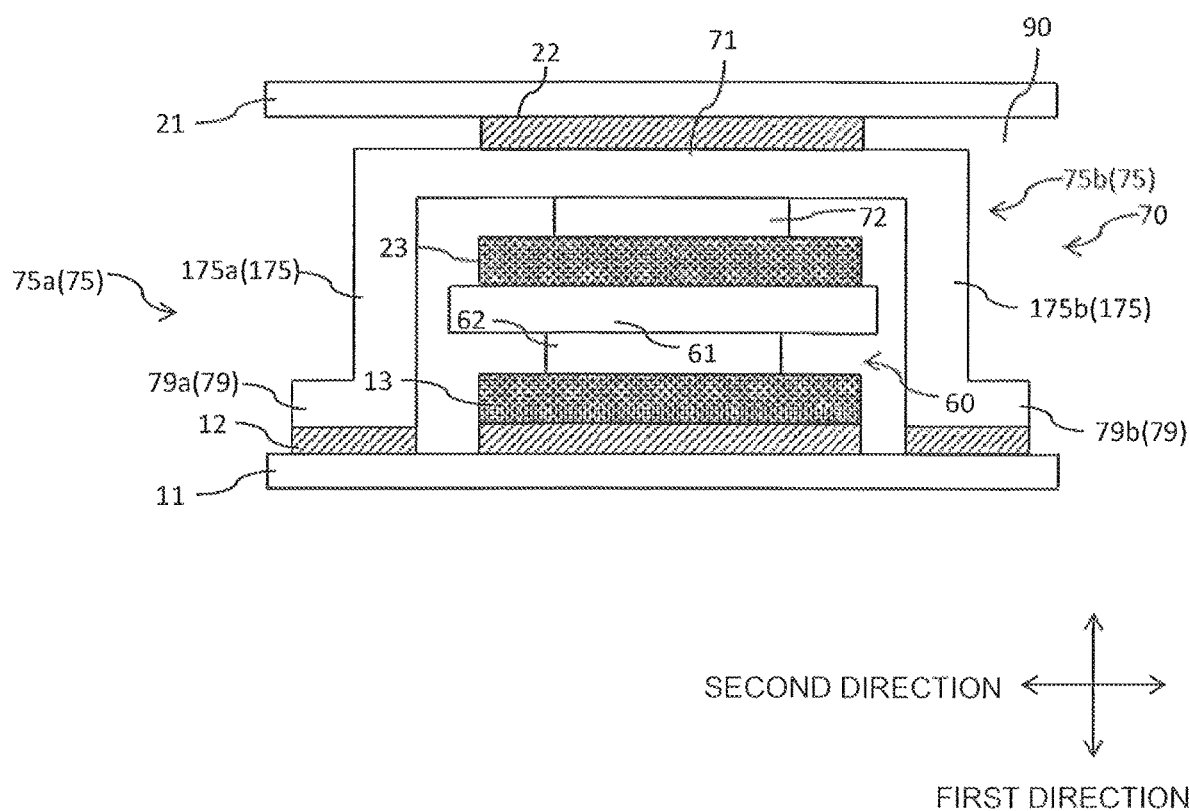
FIG. 17 is a longitudinal sectional view of an electronic module that can be used in the fifth embodiment of the present invention.

Each embodiment described above has exemplified the second connector 70 having the second columnar part 72 and a nearly T-shaped cross-section. In the present embodiment, as shown in FIG. 17, a second connector 70 has an extended part 75 (75a or 75b) extending from a second head part 71 to the other side. With regard to other constituent elements, any aspects described in the respective embodiments can be adopted. The same reference numerals denote the same members as those described in the respective embodiments.

The present embodiment will exemplify an aspect using the two extended parts 75. However, this is not exhaustive, and one or three or more extended parts 75 may be used.

According to this embodiment, providing the extended part 75 makes it possible to efficiently dissipate heat from a second electronic element 23, and allows the second connector 70 to achieve a high heat dissipation effect.

Providing the plurality of extended parts 75 as in the embodiment is beneficial in terms of achieving a higher heat dissipation effect.

Each extended part 75 may be in contact with a first conductive layer 12. The first conductive layer 12 connected to the extended part 75 may not be electrically connected to another first conductive layer 12, a second conductive layer 22, a first electronic element 13, and the second electronic element 23.

Each extended part 75 may have an extended proximal end part 79 (79a or 79b) that extends in the planar direction and is in contact with a first substrate 11 or the first conductive layer 12. In addition, each of the plurality of extended parts 75 need not be provided with the extended proximal end part 79. Instead, some of the plurality of extended parts 75 may be provided with the extended proximal end parts 79, and the remaining extended parts 75 may not be provided with any extended proximal end parts 79.

When the extended proximal end parts 79 are provided in this manner, the second connector 70 can be placed on the first substrate 11 or the first conductive layer 12 in a better-balanced state. In addition, because the extended proximal end parts 79 can increase the contact areas with the first substrate 11 or the first conductive layer 12, the heat dissipation effect can be increased.

When the extended part 75 is used as in this embodiment, it is beneficial that the second head part 71 has the second flat surface 79 outside the circumference as shown in FIG. 6, FIG. 11, and FIG. 14. When the second head part 71 is inclined along the first direction outside the circumference, the extended part 75 may not be reliably brought into contact with the first conductive layer 12 or the first substrate 11. In contrast, when the second head part 71 has the second flat surface 79 outside the circumference, the extended part 75 can be reliably brought into contact with the first conductive layer 12 or the first substrate 11. This structure is beneficial in terms of improving stability achieved by the extended part 75 and improving the heat dissipation performance. In this regard, the inclination angle of the second flat surface 79 with respect to the planar direction is preferably small, for example, equal to or less than 3°.

Providing the second groove part 74 is beneficial in terms of allowing the second flat surface 79 to be reliably extended along the planar direction. Placing the second groove part 74 at the boundary between the second flat surface 79 and the second inclined surface 78 as in the first embodiment is particularly beneficial in terms of reliably reducing the inclination angle of the second flat surface 79 with respect to the planar direction. In addition, providing the second groove part 74 in the second flat surface 79 as in the second embodiment is beneficial in terms of more reliably reducing the inclination angle with respect to the planar direction outside the circumference relative to the second groove part 74.

Adopting the aspect according to this embodiment can provide a repulsive force that makes the second connector 70 push back the second substrate 21 to one side. When heat is added to the first substrate 11 and the second substrate 21, forces act on the first substrate 11 and the second substrate 21 to cause them to warp or distort.

However, using the second connector 70 having the extended part 75 (especially, the plurality of extended parts 75) is beneficial in terms of preventing the first substrate 11 and the second substrate 21 from warping or distorting.

Note that the extended part 75 according to this embodiment has a height-direction extended part 175 (175a or 175b) extending from the second head part 71 in the height direction (first direction).

Sixth Embodiment

The sixth embodiment of the present invention will be described next.

Figure 18:
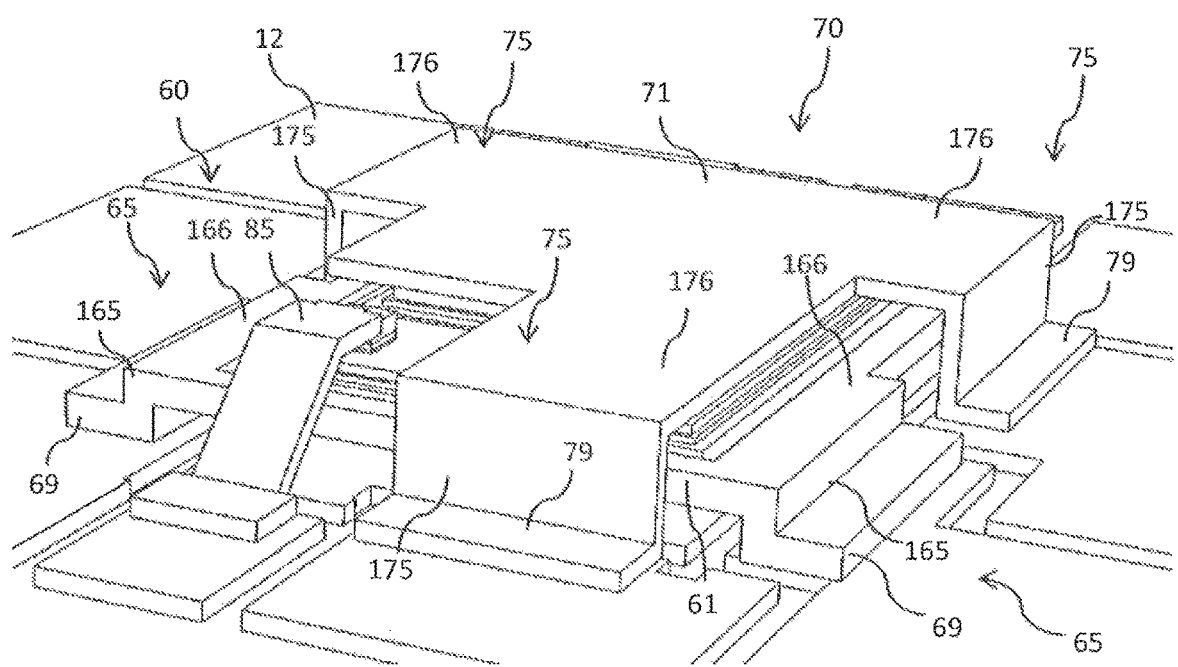
FIG. 18 is a perspective view of an electronic module that can be used in the sixth embodiment of the present invention.
Figure 19:
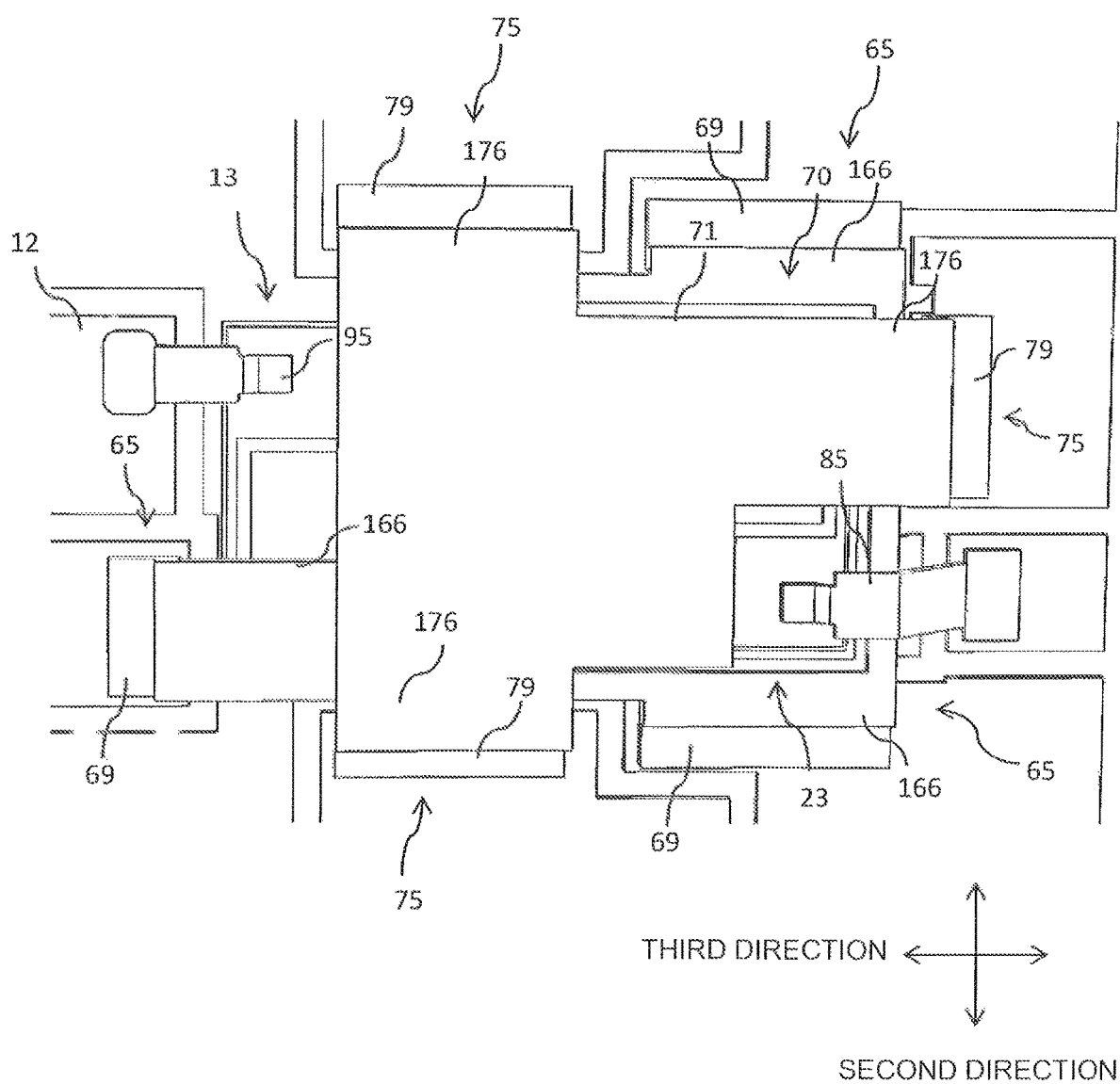
FIG. 19 is a plan view of the electronic module that can be used in the sixth embodiment of the present invention.
Figure 20:
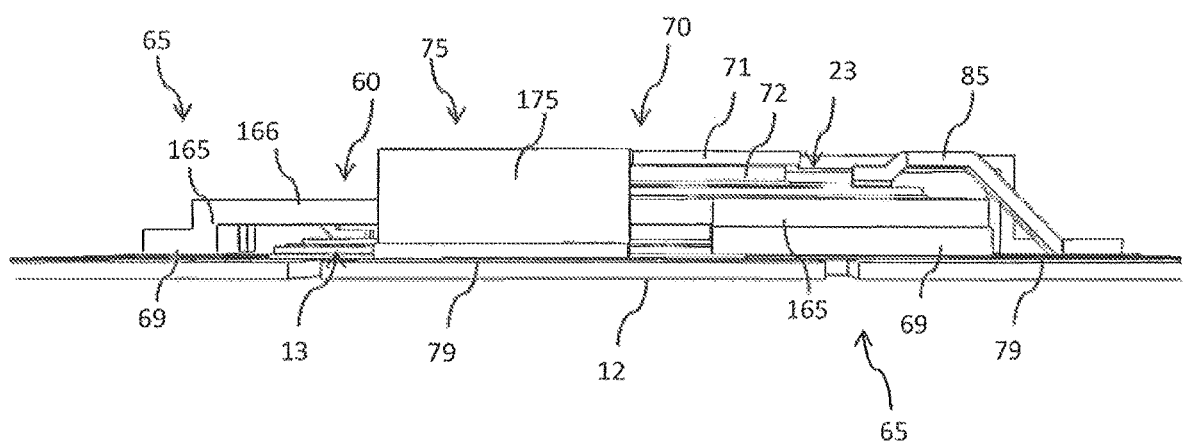
FIG. 20 is a side view of the electronic module that can be used in the sixth embodiment of the present invention.
Figure 20:
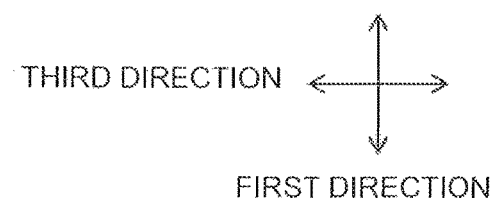

The fourth embodiment has exemplified the aspect provided with the support part 65. The fifth embodiment has exemplified the aspect provided with the extended part 75. However, both the support part 65 and the extended part 75 may be adopted. The present embodiment will exemplify an aspect using three support parts 65 and three extended parts 75, as shown in FIGS. 18 to 20. With regard to other constituent elements, any aspects described in the respective embodiments can be adopted. The same reference numerals denote the same members as those described in the respective embodiments.

As in the present embodiment, the extended part 75 may have a planar-direction extended part 176 (176a to 176c) extending from a second head part 71 in the planar direction and height-direction extended part 175 (175a to 175c) extending from the planar-direction extended part 176 in the height direction (first direction). Note that the planar-direction extended part 176 is a part having a smaller size in the widthwise direction than the second head part 71.

Note that in this embodiment, a first groove part 64 is provided in the one-side surface of a first connector 60, but a second groove part 74 is not provided for a second connector 70. Unlike such an aspect, the embodiment can adopt an aspect in which the second groove part 74 is provided in the one-side surface of the second connector 70, but the first groove part 64 is not provided for the first connector 60.

The above description of each embodiment and the disclosure of each drawing each are a merely an example for explaining the present invention described in the scope of claims, and do not limit the present invention described in the scope of claims. In addition, the description of the original claims in the present application is merely a sample, and can be changed as needed based on the description of the specification, the drawings, and the like.

REFERENCE SIGNS LIST

11 first substrate
12 first conductive layer
13 first electronic element
23 second electronic element
60 first connector
62 first columnar part
64 first groove part
67 first concave part
68 first inclined surface
69 first flat surface
70 second connector
72 second columnar part
300 conductive plate
400 mold
410 mold concave part
450 pressing member
460 protruding part

The invention claimed is:

1. An electronic module comprising:
   a first electronic element;
   a second electronic element;
   a connector provided on a lower side of the second electronic element, the connector having an upper surface on which the second electronic element is provided;
   a columnar connector part extending from a lower surface of the connector;
      wherein the first electronic element is provided on a lower side of the columnar connector part, wherein
   the upper surface of the connector has a concave part at a position corresponding to the columnar connector part,
   the upper surface of the connector comprises an inclined surface included in the concave part, and a flat surface provided outside a circumference of the inclined surface, and
   a groove part is provided at a boundary between the inclined surface and the flat surface, and the columnar connector part is positioned lower than a bottom edge of the groove part.

* * * * *